US 6,734,816 B2

(12) United States Patent
Morimoto et al.

(10) Patent No.: US 6,734,816 B2
(45) Date of Patent: May 11, 2004

(54) D/A CONVERTER WITH HIGH JITTER RESISTANCE

(75) Inventors: Yasuo Morimoto, Tokyo (JP); Toshio Kumamoto, Tokyo (JP); Takashi Okuda, Tokyo (JP)

(73) Assignee: Mitsubishi Denki Kabushiki Kaisha, Chiyoda-ku (JP)

(*) Notice: Subject to any disclaimer, the term of this patent is extended or adjusted under 35 U.S.C. 154(b) by 0 days.

(21) Appl. No.: 10/408,238

(22) Filed: Apr. 8, 2003

(65) Prior Publication Data

US 2004/0061634 A1 Apr. 1, 2004

(30) Foreign Application Priority Data

Sep. 30, 2002 (JP) ........................................ 2002-286656

(51) Int. Cl.[7] ................................................ H03M 1/66
(52) U.S. Cl. ........................ 341/144; 341/143; 341/165; 341/172
(58) Field of Search ................................ 341/144, 143, 341/165, 172

(56) References Cited

U.S. PATENT DOCUMENTS

| 4,641,246 A | * | 2/1987 | Halbert et al. ............... 341/163 |
| 4,947,171 A | * | 8/1990 | Pfeifer et al. ................ 341/143 |
| 5,272,481 A | * | 12/1993 | Sauer ........................ 341/165 |
| 5,727,024 A | * | 3/1998 | Hauptmann ................. 341/144 |
| 6,031,477 A | * | 2/2000 | Mercer ....................... 341/144 |
| 6,061,010 A | | 5/2000 | Adams et al. |
| 6,628,219 B2 | * | 9/2003 | Dedic ......................... 341/144 |

OTHER PUBLICATIONS

David A. Johns et al., "Linearity of Two–Level converts", Analog Integrated Circuit Design, Chapter 14, Section 14.7, pp. 560–563.

* cited by examiner

Primary Examiner—Michael Tokar
Assistant Examiner—Lam T. Mai
(74) Attorney, Agent, or Firm—Burns, Doane, Swecker & Mathis, L.L.P.

(57) ABSTRACT

A D/A converter including a plurality of potential generating sections. They each receive a 1-bit signal from one of an input terminal and delay circuit, and a clock signal or inverted clock signal from an input section or inverter for inverting the clock signal. When the clock signal or inverted clock signal is at a first signal level, they generate a first reference potential or second reference potential in response to the signal level of the 1-bit signal. When the clock signal or inverted clock signal is at the second level, they generate an intermediate potential between the first and second reference potentials. The potentials generated by the plurality of potential generating sections are combined by a combining section. The D/A converter can improve resistance to jitter, and to simplify the configuration of a post-stage filter circuit.

9 Claims, 23 Drawing Sheets

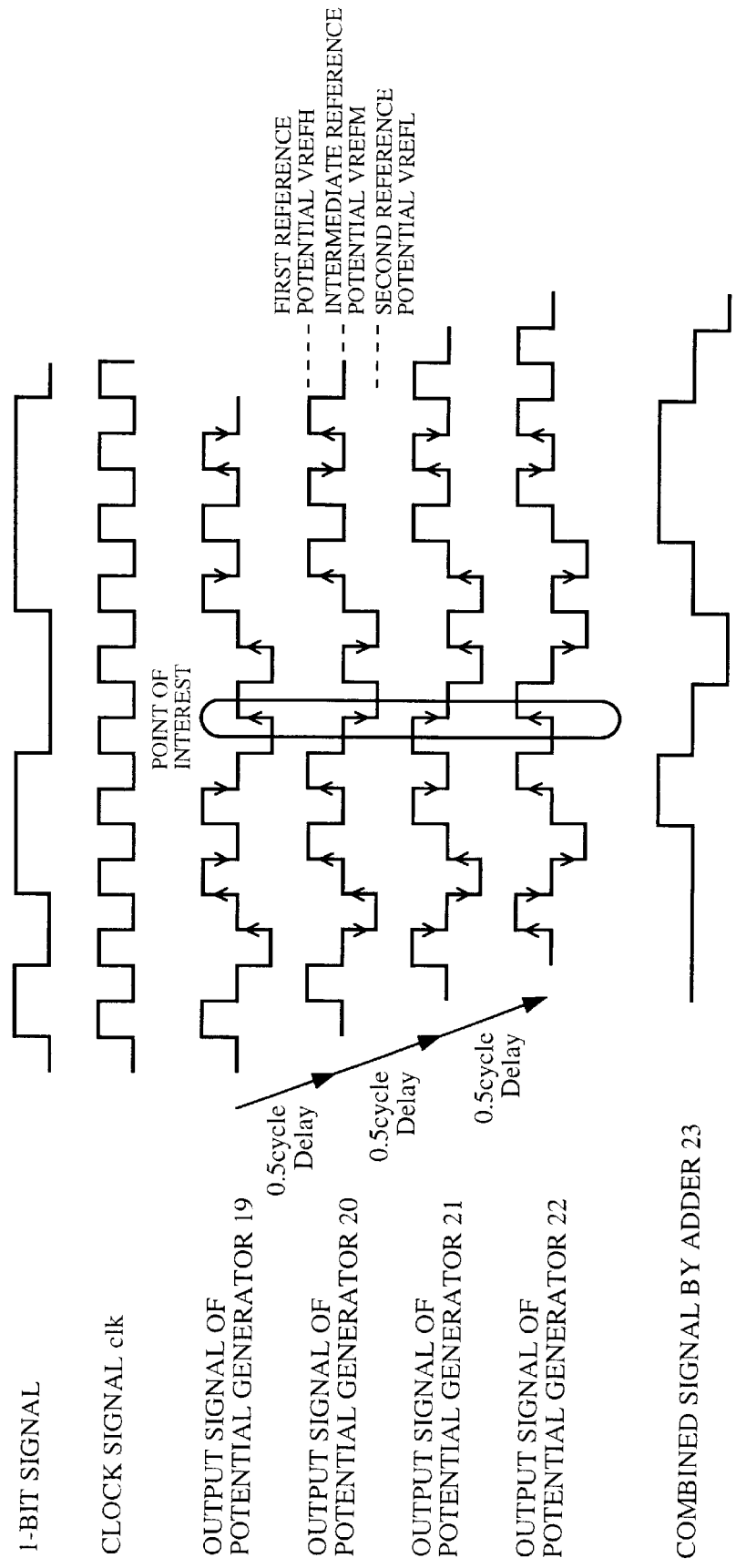

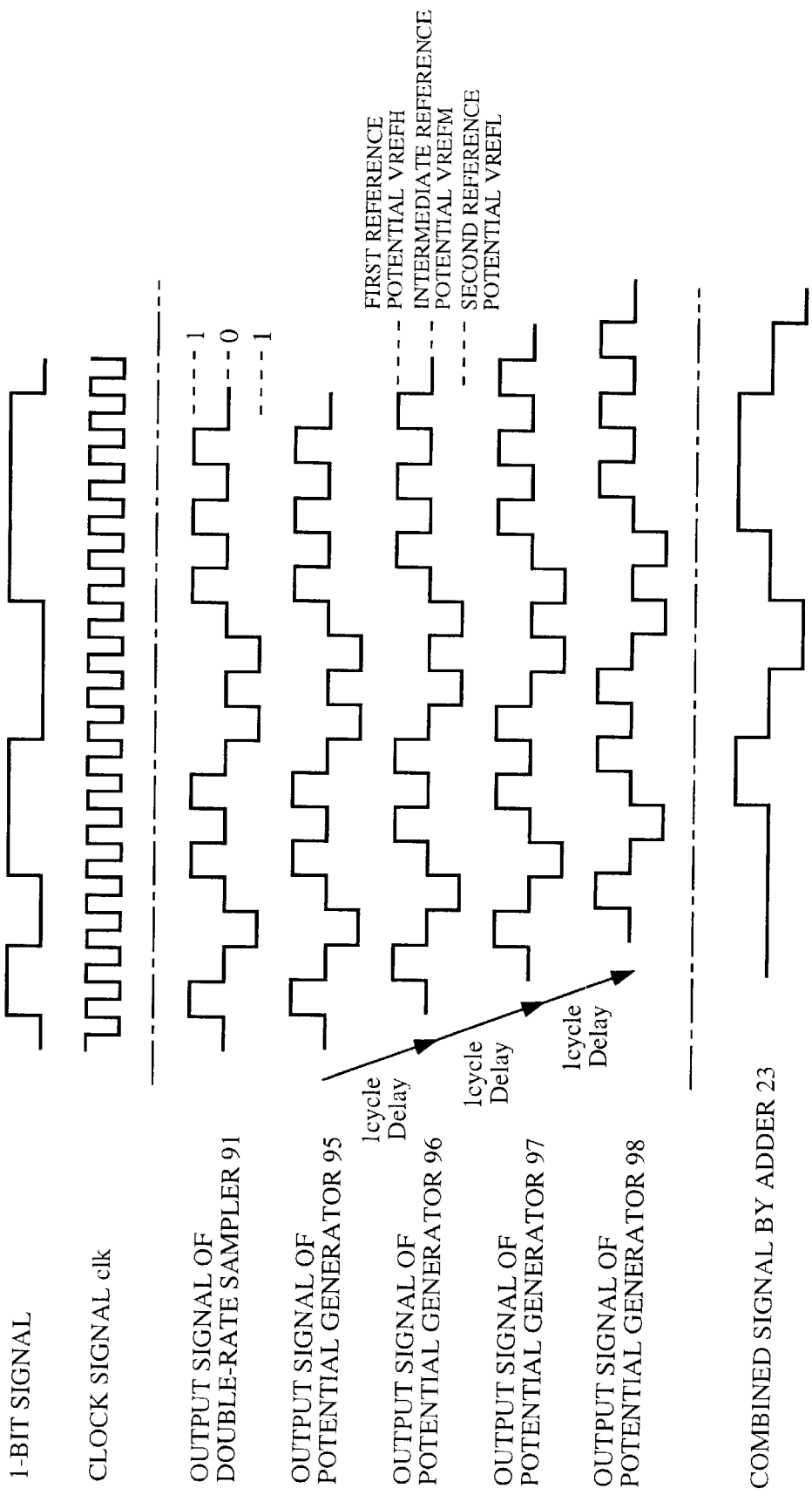

D/A CONVERTER WITH HIGH JITTER RESISTANCE

BACKGROUND OF THE INVENTION

1. Field of the Invention

The present invention relates to a D/A converter mounted on audio equipment for converting an audio signal (1-bit digital signal) to an analog signal.

2. Description of Related Art

FIG. 24 is a block diagram showing a configuration of a part of audio equipment to which a conventional D/A converter is applied. In FIG. 24, the reference numeral 1 designates a delta-sigma modulator (called "$\Delta\Sigma$-modulator" from now on) for carrying out parallel-to-serial conversion of a 16-bit parallel audio signal, for example, in synchronization with a clock signal CLK, and for outputting a 1-bit serial audio signal (called "1-bit signal" from now on); 2 designates a 1-bit D/A converter for converting the 1-bit signal output from the $\Delta\Sigma$-modulator 1 to an analog signal in synchronization with a clock signal clk with a frequency lower than that of the clock signal CLK supplied to the $\Delta\Sigma$-modulator 1; and 3 designates a filter circuit for eliminating noise components contained in the output signal of the 1-bit D/A converter 2, thereby outputting a signal component.

Next, the operation of the conventional equipment will be described.

Receiving the 16-bit parallel audio signal, the $\Delta\Sigma$-modulator 1 carries out the parallel-to-serial conversion of the audio signal in synchronization with clock signal CLK, and outputs a 1-bit signal, that is, a 1-bit serial audio signal.

FIG. 25A illustrates frequency characteristics of the 1-bit signal, in which fs designates the frequency of the clock signal CLK. The 1-bit signal includes large noise components besides the signal component.

Receiving the 1-bit signal from the $\Delta\Sigma$-modulator 1, the 1-bit D/A converter 2 carries out the digital-to-analog conversion of the 1-bit signal.

More specifically, as shown in FIG. 26(a), when the 1-bit signal output from the $\Delta\Sigma$-modulator 1 is at a high level, the 1-bit D/A converter 2 generates a first reference potential, whereas when the 1-bit signal is at a low level, it generates a second reference potential lower than the first reference potential.

In this case, the ideal waveform of the output signal of the 1-bit D/A converter 2 is as shown in FIG. 26(a). In practice, however, there arise overshoots and undershoots as shown in FIG. 26(b) at transitions of the voltage waveform. Accordingly, area components (energy S) per cycle of the output signal fluctuate, which presents a problem of being unable to maintain the linearity of the output signal corresponding to the 1-bit signal.

In view of this, the conventional 1-bit D/A converter 2 employs an RTZ (Return-To-Zero) scheme that forcedly drops the latter half of the one cycle to the second reference potential as shown in FIG. 26(c).

The RTZ scheme, however, sometimes presents a problem in that since it increases the number of transitions (edges) of the output signal, the area components of the output signal can fluctuate because of jitter at the edges as illustrated in FIG. 27, thereby bringing about noise.

FIG. 25B shows the frequency characteristics of the output signal of the 1-bit D/A converter 2. It shows that although the noise components near the is reduce as compared with the frequency characteristics of the 1-bit signal, large noise components still remain.

The filter circuit 3 removes the noise components from the output signal to separate only the signal component from the output signal of the 1-bit D/A converter 2.

With the foregoing configuration, the conventional D/A converter has a problem of degrading the SNR because the jitter due to an increase in the number of the transitions of the output signal causes additional noise. Furthermore, although it can reduce the noise component near the is, the remaining noise components present a problem of complicating the circuit configuration of the filter circuit 3.

SUMMARY OF THE INVENTION

The present invention is implemented to solve the foregoing problems. It is therefore an object of the present invention to provide a D/A converter capable of improving the jitter tolerance and simplifying the circuit configuration of the filter circuit.

According to a first aspect of the present invention, there is provided a D/A converter including a plurality of potential generating means each for receiving a 1-bit signal from one of an input terminal and delay circuit, and a clock signal or inverted clock signal from input means or inverter for inverting the clock signal. When the clock signal or inverted clock signal is at a first signal level, they generate one of a first reference potential and a second reference potential in response to the signal level of-the 1-bit signal. When the clock signal or inverted clock signal is at a second level, they generate an intermediate potential between the first and second reference potentials. The potentials generated by the plurality of potential generating means are combined by combining means. The D/A converter can not only improve resistance to jitter, but also to simplify the configuration of a post-stage filter circuit.

According to a second aspect of the present invention, there is provided a D/A converter including a plurality of potential generating means each for receiving a level signal output from one of signal converting means and delay circuits, and for outputting a potential corresponding to the level signal. The potentials generated by the plurality of potential generating means are combined by combining means. The D/A converter can improve resistance to jitter, and to simplify the configuration of a post-stage filter circuit.

BRIEF DESCRIPTION OF THE DRAWINGS

FIG. 3 is a diagram illustrating waveforms of various signals;

FIG. 8 is a diagram illustrating waveforms of various signals of FIG. 7;

DETAILED DESCRIPTION OF THE PREFERRED EMBODIMENTS

The invention will now be described with reference to the accompanying drawings.

Embodiment 1

Figure 1:
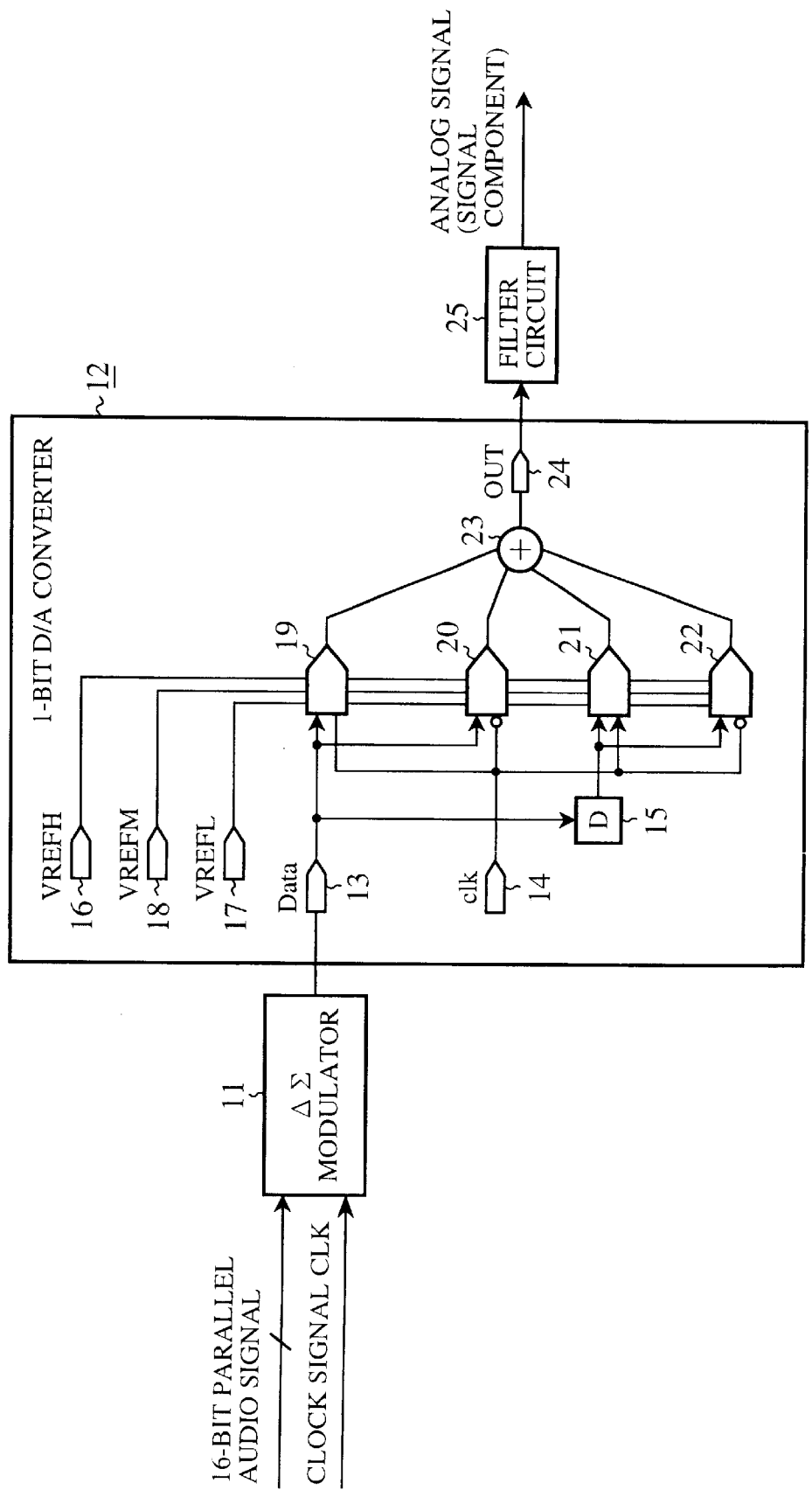
FIG. 1 is a block diagram showing a configuration of a part of audio equipment to which an embodiment 1 of the D/A converter in accordance with the present invention is applied.

FIG. 1 is a block diagram showing a configuration of a part of audio equipment to which an embodiment 1 of the D/A converter in accordance with the present invention is applied. In FIG. 1, the reference numeral 11 designates a delta-sigma modulator (called "ΔΣ-modulator" from now on) for carrying out parallel-to-serial conversion of a 16-bit parallel audio signal, for example, in synchronization with a clock signal CLK, and for outputting a 1-bit serial audio signal (called "1-bit signal" from now on); and 12 designates a 1-bit D/A converter for converting the 1-bit signal output from the ΔΣ-modulator 11 to an analog signal in synchronization with a clock signal clk with a frequency lower than that of the clock signal CLK supplied to the ΔΣ-modulator 11.

The reference numeral 13 designates a data terminal for receiving the 1-bit signal output from the ΔΣ-modulator 11; and 14 designates a clock terminal for receiving the clock signal clk with a frequency lower than the clock signal CLK supplied to the ΔΣ-modulator 11. The data terminal 11 and clock terminal 12 constitute an input means.

The reference numeral 15 designates a delay circuit (delay means) for delaying the 1-bit signal fed via the data terminal 13; 16 designates a potential input terminal for inputting a first reference potential VREFH; 17 designates a potential input terminal for inputting a second reference potential VREFL; and 18 designates a potential input terminal for inputting an intermediate reference potential VREFM between the first reference potential VREFH and the second reference potential VREFL.

The reference numeral 19 designates a potential generator for generating the first reference potential VREFH, second reference potential VREFL or intermediate reference potential VREFM. More specifically, receiving the 1-bit signal and clock signal clk from the data terminal 13 and clock terminal 14, respectively, the potential generator 19 generates the first reference potential VREFH or second reference potential VREFL in response to the signal level of the 1-bit signal when the clock signal clk is at the high level (first level), and generates the intermediate reference potential VREFM when the clock signal clk is at the low level (second level). The reference numeral 20 designates a potential generator for generating the first reference potential VREFH, second reference potential VREFL or intermediate reference potential VREFM. More specifically, inverting the clock signal clk fed from the clock terminal 14, the potential generator 20 generates the first reference potential VREFH or second reference potential VREFL in response to the signal level of the 1-bit signal fed from the data terminal 13 when the inverted clock signal clk is at the high level, and generates the intermediate reference potential VREFM when the inverted clock signal clk is at the low level.

The reference numeral 21 designates a potential generator for generating the first reference potential VREFH, second reference potential VREFL or intermediate reference potential VREFM. More specifically, receiving the delayed 1-bit signal and clock signal clk from the delay circuit 15 and clock terminal 14, respectively, the potential generator 21 generates the first reference potential VREFH or second reference potential VREFL in response to the signal level of the 1-bit signal when the clock signal clk is at the high level, and generates the intermediate reference potential VREFM when the clock signal clk is at the low level. The reference numeral 22 designates a potential generator for generating the first reference potential VREFH, second reference potential VREFL or intermediate reference potential VREFM. More specifically, inverting the clock signal clk fed from the clock terminal 14, the potential generator 22 generates the first reference potential VREFH or second reference potential VREFL in response to the signal level of the delayed 1-bit signal fed from the delay circuit 15 when the inverted clock signal clk is at the high level, and generates the intermediate reference potential VREFM when the inverted clock signal clk is at the low level. The reference numeral 23 designates an adder for combining the potentials supplied from the potential generators 19–22; 24 designates an output terminal for producing the combined signal output from the adder 23; and 25 designates a filter circuit for removing the noise components from the output signal of the 1-bit D/A converter 12 to output the signal component.

Next, the operation of the present embodiment 1 will be described.

Receiving the 16-bit parallel audio signal, for example, the a $\Delta\Sigma$-modulator 11 carries out the parallel-to-serial conversion of the audio signal in synchronization with the clock signal CLK, and outputs the 1-bit signal, the 1-bit serial audio signal.

Figure 2A:
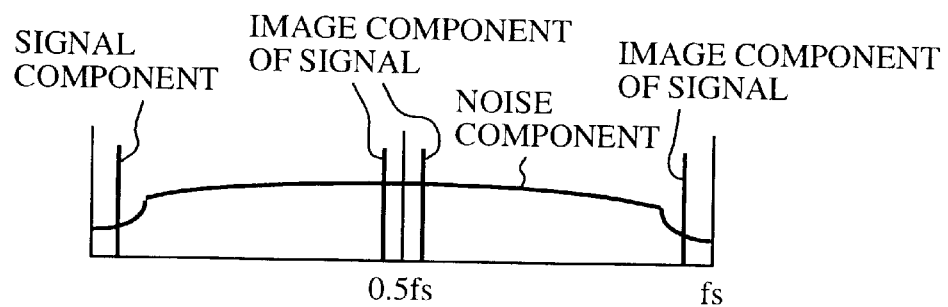
FIGS. 2A–2C are diagrams illustrating frequency characteristics and the like of a 1-bit signal.
Figure 2B:
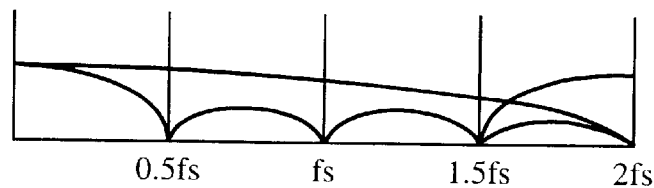
Figure 2C:
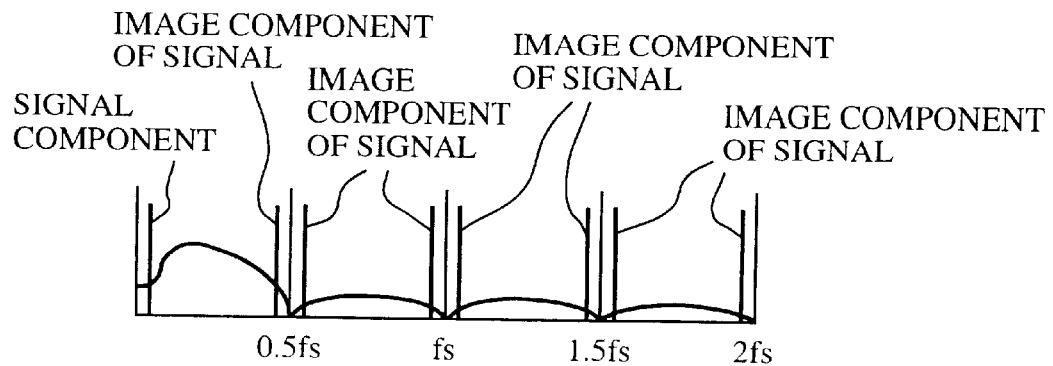

Here, FIG. 2A illustrates the frequency characteristics of the 1-bit signal that includes large noise components besides the signal component. In FIGS. 2A–2C, is designates the frequency of the clock signal CLK.

Receiving the 1-bit signal from the $\Delta\Sigma$-modulator 11, the 1-bit D/A converter 12 carries out the digital-to-analog conversion of the 1-bit signal.

The detail of the conversion is as follows.

First, the data terminal 13 of the 1-bit D/A converter 12 receives the 1-bit signal from the $\Delta\Sigma$-modulator 11, and the clock terminal 14 of the 1-bit D/A converter 12 receives the clock signal clk (see, FIG. 3).

The delay circuit 15 of the 1-bit D/A converter 12 delays the 1-bit signal supplied from the data terminal 13. Specifically, receiving the 1-bit signal, the delay circuit 15 outputs it after holding it for one period of the clock signal clk.

Thus, the potential generators 19 and 20 are supplied with the 1-bit signal from the data terminal 13, whereas the potential generators 21 and 22 are supplied with the delayed 1-bit signal from the delay circuit 15.

Receiving the 1-bit signal and clock signal clk from the data terminal 13 and clock terminal 14, the potential generator 19 of the 1-bit D/A converter 12 generates, when the clock signal clk is at the high level, the first reference potential VREFH when the 1-bit signal is at the high level, and the second reference potential VREFL when the 1-bit signal is at the low level as shown in FIG. 3. In addition, it generates the intermediate reference potential VREFM independently of the signal level of the 1-bit signal when the clock signal clk is at the low level.

Receiving the 1-bit signal and the clock signal clk from the data terminal 13 and clock terminal 14, the potential generator 20 of the 1-bit D/A converter 12 inverts the clock signal clk.

When the inverted clock signal clk is at the high level, the potential generator 20 generates the first reference potential VREFH when the 1-bit signal is at the high level, and the second reference potential VREFL when the 1-bit signal is at the low level. In addition, it generates the intermediate reference potential VREFM independently of the signal level of the 1-bit signal when the inverted clock signal clk is at the low level.

As is easily seen from FIG. 3, the potential waveform of the potential generator 20 delays from that of the potential generator 19 by half the period of the clock signal clk because the inverted clock signal clk is used.

Receiving the delayed 1-bit signal and clock signal clk from the delay circuit 15 and clock terminal 14, the potential generator 21 of the 1-bit D/A converter 12 generates, when the clock signal clk is at the high level, the first reference potential VREFH when the delayed 1-bit signal is at the high level, and the second reference potential VREFL when the delayed 1-bit signal is at the low level. In addition, it generates the intermediate reference potential VREFM independently of the signal level of the delayed 1-bit signal when the clock signal clk is at the low level.

As is easily seen from FIG. 3, the potential waveform of the potential generator 21 delays from that of the potential generator 19 by one period of the clock signal ckl because the delayed 1-bit signal is supplied from the delay circuit 15.

Receiving the delayed 1-bit signal and the clock signal clk from the delay circuit 15 and clock terminal 14, the potential generator 22 of the 1-bit D/A converter 12 inverts the clock signal clk.

When the inverted clock signal clk is at the high level, the potential generator 22 generates the first reference potential VREFH when the delayed 1-bit signal is at the high level, and the second reference potential VREFL when the delayed 1-bit signal is at the low level. In addition, it generates the intermediate reference potential VREFM independently of the signal level of the delayed 1-bit signal when the inverted clock signal clk is at the low level.

As is easily seen from FIG. 3, the potential waveform of the potential generator 22 delays from that of the potential generator 21 by half the period of the clock signal ckl because the inverted clock signal clk is used.

When the potential generators 19–22 generate the potentials as described above, the adder 23 of the 1-bit D/A converter 12 combines the potentials by summing them up as shown in FIG. 3.

Figure 27:
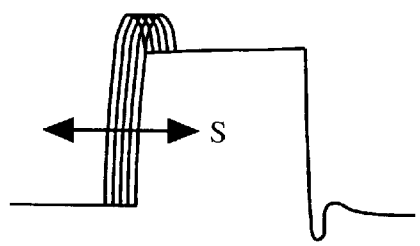
FIG. 27 is a diagram illustrating fluctuations in an area component of the output signal.

For example, at the point of interest in FIG. 3, the potentials of the potential generators 19 and 22 increase, but the potentials of the potential generators 20 and 21 decrease. Accordingly, the fluctuations at the rising edges and falling edges of the waveforms caused by the jitter components contained in the input clock signal ckl are canceled out by combining the signals. Consequently, the effect of the potential variations is eliminated from the combined signal output from the adder 23. In other words, although the individual waveforms have fluctuations at the rising and falling edges because of the jitter contained in the clock signal ckl, and hence have fluctuations in the area as shown in FIG. 27, the combined waveform has little fluctuations in the area because the fluctuations at the rising edges of the waveforms are canceled out by the fluctuations at the falling edges of the waveforms. As a result, the output waveform is more resistant to the jitter of the clock signal clk.

At the points indicated by arrows in FIG. 3 other than at the point of interest, the fluctuations at the rising edges and falling edges of the waveforms are also canceled out.

This enables the output terminal 24 to output the analog signal (signal combined by the adder 23) with a high jitter tolerance.

FIG. 2B illustrates the frequency characteristic of the 1-bit D/A converter 12, and FIG. 2C illustrates the frequency characteristic of the output signal of the 1-bit D/A converter 12. As clearly seen from FIG. 2C, the noise components around the frequencies 0.5 fs, is and 1.5 fs are reduced sharply.

The filter circuit 25 removes the noise components from the output signal to separate only the signal component from the output signal of the 1-bit D/A converter 12.

In this case, the restrictions on the filter characteristics can be relaxed because the noise components contained in the output signal are much smaller than those of the conventional 1-bit D/A converter. Consequently, the circuit configuration of the filter circuit 25 can be simplified.

As described above, the present embodiment 1 is configured such that the potential generators 19–22 generate the first reference potential VREFH or second reference potential VREFL in response to the signal level of the 1-bit signal when they are supplied with the 1-bit signal or delayed 1-bit signal from the data terminal 13 or delay circuit 14 and when the clock signal supplied from the clock terminal 14 or its inverted clock signal is at the high level, and generate the intermediate reference potential VREFM when the clock signal is at the low level, and that the potentials output by the potential generators 19–22 are combined. Thus, the present embodiment 1 offers advantages of being able to increase the jitter tolerance, and to simplify the circuit configuration of the post-stage filter circuit 25.

Embodiment 2

Figure 4:
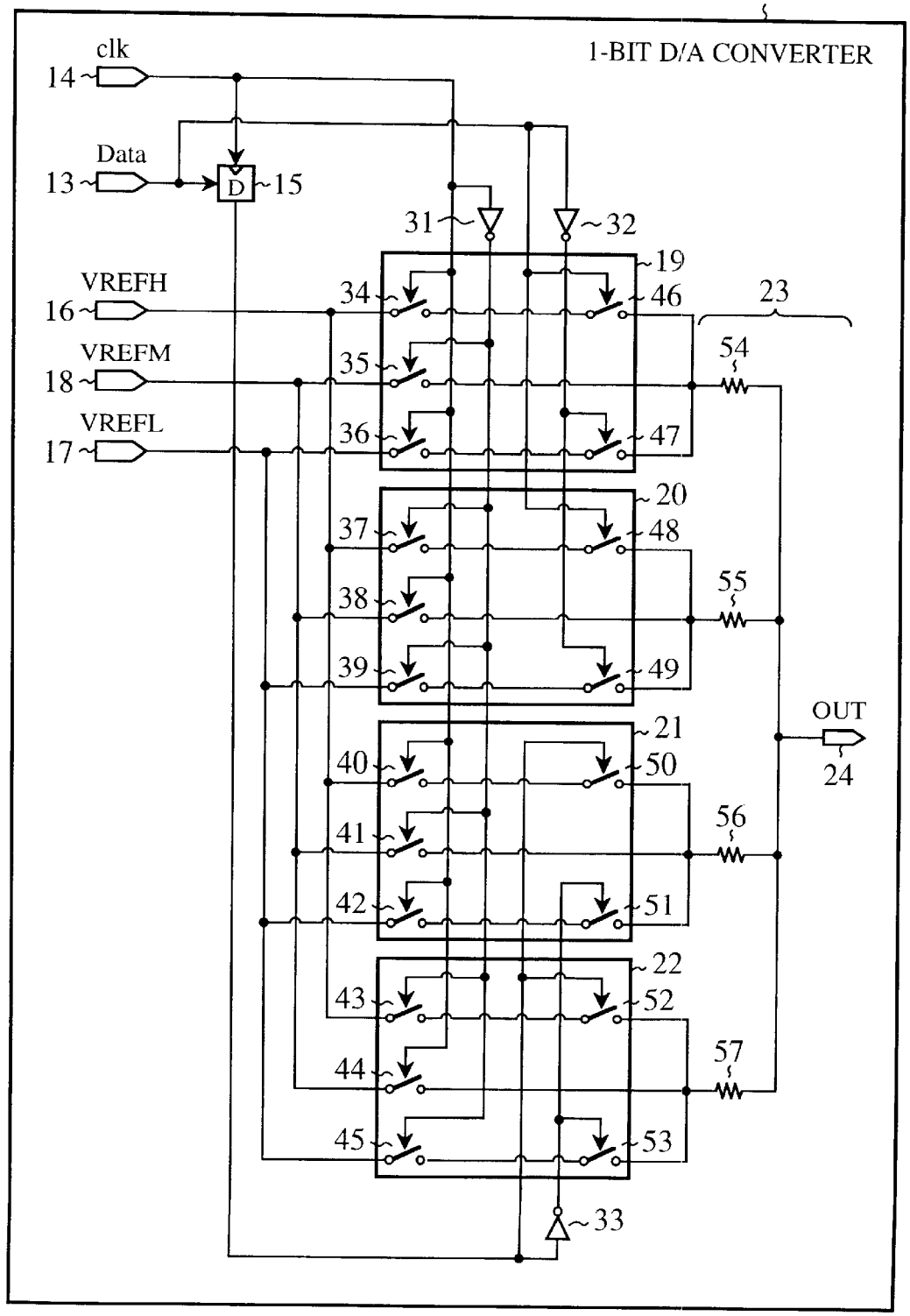
FIG. 4 is a circuit diagram showing a detailed configuration of the potential generators and adder of the 1-bit D/A converter.

FIG. 4 is a circuit diagram showing a detailed configuration of the potential generators 19–22 and adder 23 of the 1-bit D/A converter 12. In FIG. 4, the same reference numerals as those of FIG. 1 designate the same or like portions, and the description thereof is omitted here.

In FIG. 4, the reference numeral 31 designates an inverter for inverting the clock signal clk supplied from the clock terminal 14; 32 designates an inverter for inverting the 1-bit signal supplied from the data terminal 13; and 33 designates an inverter for inverting the 1-bit signal delayed by the delay circuit 15. Reference numerals 34, 36, 38, 40, 42 and 44 each designate a transistor that conducts when the clock signal clk supplied from the clock terminal 14 is at the high level; and 35, 37, 39, 41, 43 and 45 each designate a transistor that conducts when the clock signal clk inverted by the inverter 31 is at the high level.

Reference numerals 46 and 48 each designate a transistor that conducts when the 1-bit signal supplied from the data terminal 13 is at the high level; and 47 and 49 each designate a transistor that conducts when the 1-bit signal inverted by the inverter 32 is at the high level. Reference numerals 50 and 52 each designate a transistor that conducts when the 1-bit signal delayed by the delay circuit 15 is at the high level; and 51 and 53 each designate a transistor that conducts when the delayed 1-bit signal inverted by the inverter 33 is at the high level. Reference numerals 54–57 each designate a resistor for converting a voltage to a current.

Next, the operation of the present embodiment 2 will be described.

The transistors 34, 35, 36, 46 and 47 correspond to the potential generator 19. The transistors 34 and 36 conduct when the clock signal clk supplied from the clock terminal 14 is at the high level. In this case, the transistor 35 is out of conduction because the clock signal clk inverted by the inverter 31 is at the low level. Accordingly, the intermediate reference potential VREFM is not applied to the resistor 54.

The transistor 46 conducts when the 1-bit signal supplied from the data terminal 13 is at the high level. In contrast, the transistor 47 conducts when the 1-bit signal inverted by the inverter 32 is at the high level (that is, when the 1-bit signal supplied from the data terminal 13 is at the low level).

Consequently, when the 1-bit signal supplied from the data terminal 13 is at the high level in this case, the first reference potential VREFH is applied to the resistor 54. In contrast, when the 1-bit signal is at the low level, the second reference potential VREFL is applied to the resistor 54.

On the other hand, the transistors 34 and 36 are brought out of conduction when the clock signal clk supplied from the clock terminal 14 is at the low level so that neither the first reference potential VREFH nor the second reference potential VREFL is supplied to the resistor 54.

In this case, the transistor 35 conducts because the clock signal clk inverted by the inverter 31 is at the high level. Accordingly, the intermediate reference potential VREFM is applied to the resistor 54.

The transistors corresponding to the potential generators 20–22 operate in the same manner. The resistors 54–57 corresponding to the adder 23, each of which receives the potential (first reference potential VREFH, second reference potential VREFL or intermediate reference potential VREFM) from the corresponding one of the potential generators 19–22, and produces the current corresponding to the voltage, combine the currents and supply the combined current to the output terminal 24.

The present embodiment 2 offers an advantage of being able to construct the potential generators 19–22 and adder 23 without complicating their configuration.

Figure 5:
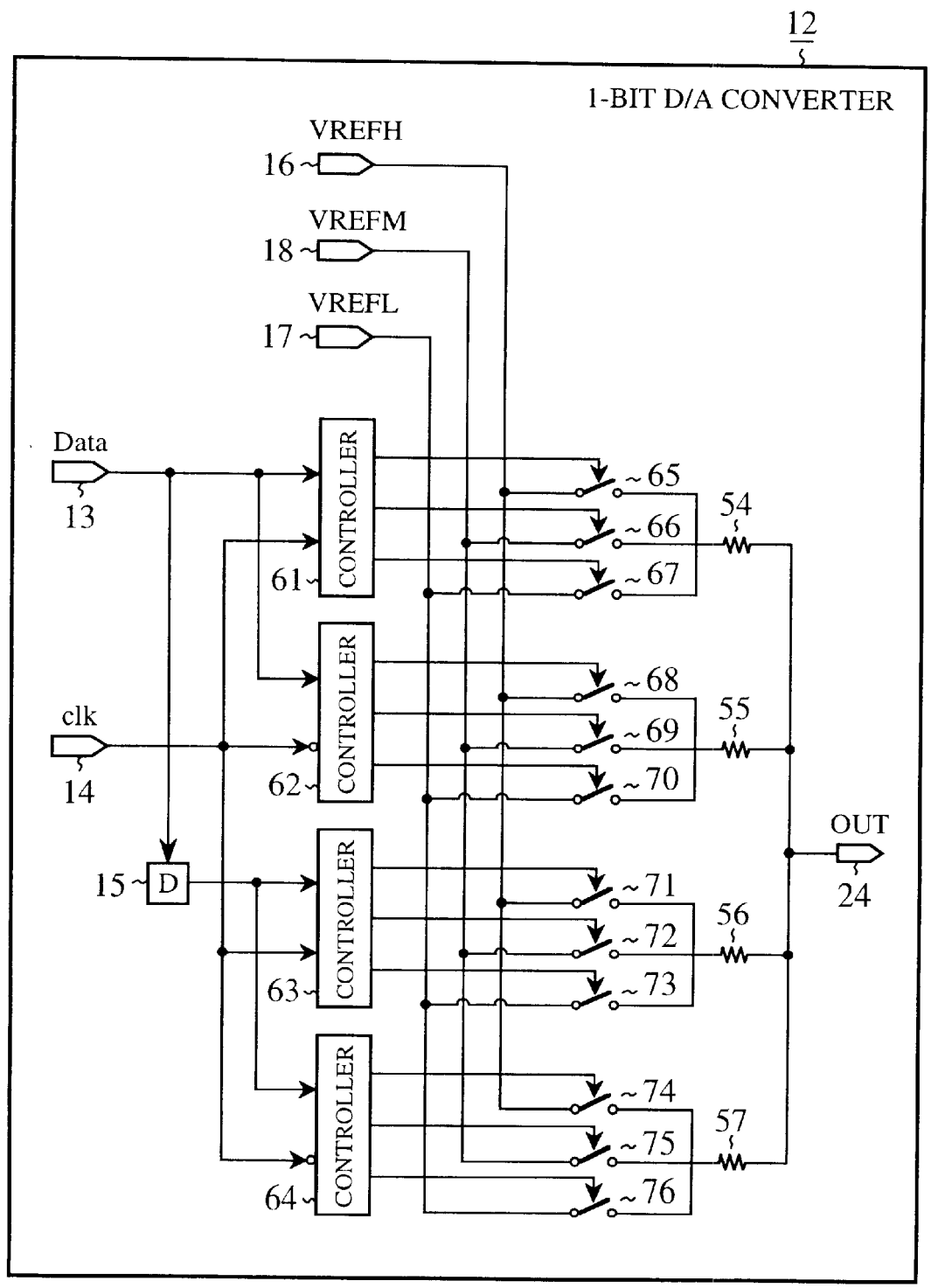
FIG. 5 is a circuit diagram showing another detailed configuration of the potential generators and adder of the 1-bit D/A converter.

FIG. 5 is a block circuit showing another detailed configuration of the potential generators 19–22 and adder 23 of the 1-bit D/A converter 12. In. FIG. 5, the same reference numerals as those of FIG. 4 designate the same or like portions, and the description thereof is omitted here.

The reference numeral 61 designates a controller supplied with the 1-bit signal and clock signal clk from the data terminal 13 and clock terminal 14, respectively. When the clock signal clk is at the high level, the controller 61 brings only the transistor 65 into conduction when the 1-bit signal is at the high level, and only the transistor 67 into conduction when the 1-bit signal is at the low level. In contrast, when the clock signal clk is at the low level, the controller 61 brings only the transistor 66 into conduction. The reference numeral 62 designates a controller inverting the clock signal clk fed from the clock terminal 14. When the inverted clock signal is at the high level, the controller 62 brings only the transistor 68 into conduction when the 1-bit signal supplied from the data terminal 13 is at the high level, and only the transistor 70 into conduction when the 1-bit signal is at the low level. In contrast, when the inverted clock signal is at the low level, the controller 62 brings only the transistor 69 into conduction.

The reference numeral 63 designates a controller supplied with the 1-bit signal delayed by the delay circuit 15 and the clock signal clk from the clock terminal 14. When the clock signal clk is at the high level, the controller 63 brings only the transistor 71 into conduction when the delayed 1-bit signal is at the high level, and only the transistor 73 into conduction when the delayed 1-bit signal is at the low level. In contrast, when the clock signal clk is at the low level, the controller 63 brings only the transistor 72 into conduction. The reference numeral 64 designates a controller inverting the clock signal clk fed from the clock terminal 14. When the inverted clock signal is at the high level, the controller 64 brings only the transistor 74 into conduction when the 1-bit signal delayed by the delay circuit 15 is at the high level, and only the transistor 76 into conduction when the delayed 1-bit signal is at the low level. In contrast, when the inverted clock signal is at the low level, the controller 64 brings only the transistor 75 into conduction.

Reference numerals 65, 66 and 67 each designate a transistor brought into conduction or out of conduction under the control of the controller 61. Reference numerals 68, 69 and 70 each designate a transistor brought into conduction or out of conduction under the control of the controller 62. Reference numerals 71, 72 and 73 each designate a transistor brought into conduction or out of conduction under the control of the controller 63. Reference numerals 74, 75 and 76 each designate a transistor brought into conduction or out of conduction under the control of the controller 64.

The example of FIG. 4 constructs the potential generators 19–22 with the inverters 31–33 and transistors 34–53. On the other hand, the present embodiment 2 constructs the potential generators 19–22 with the controllers 61–64 and transistors 65–76 as shown in FIG. 5. Thus, the present embodiment 2 offers an advantage of being able to construct the potential generators 19–22 with reducing the on-state resistance of the transistors and without complicating the configuration.

Embodiment 3

Figure 6:
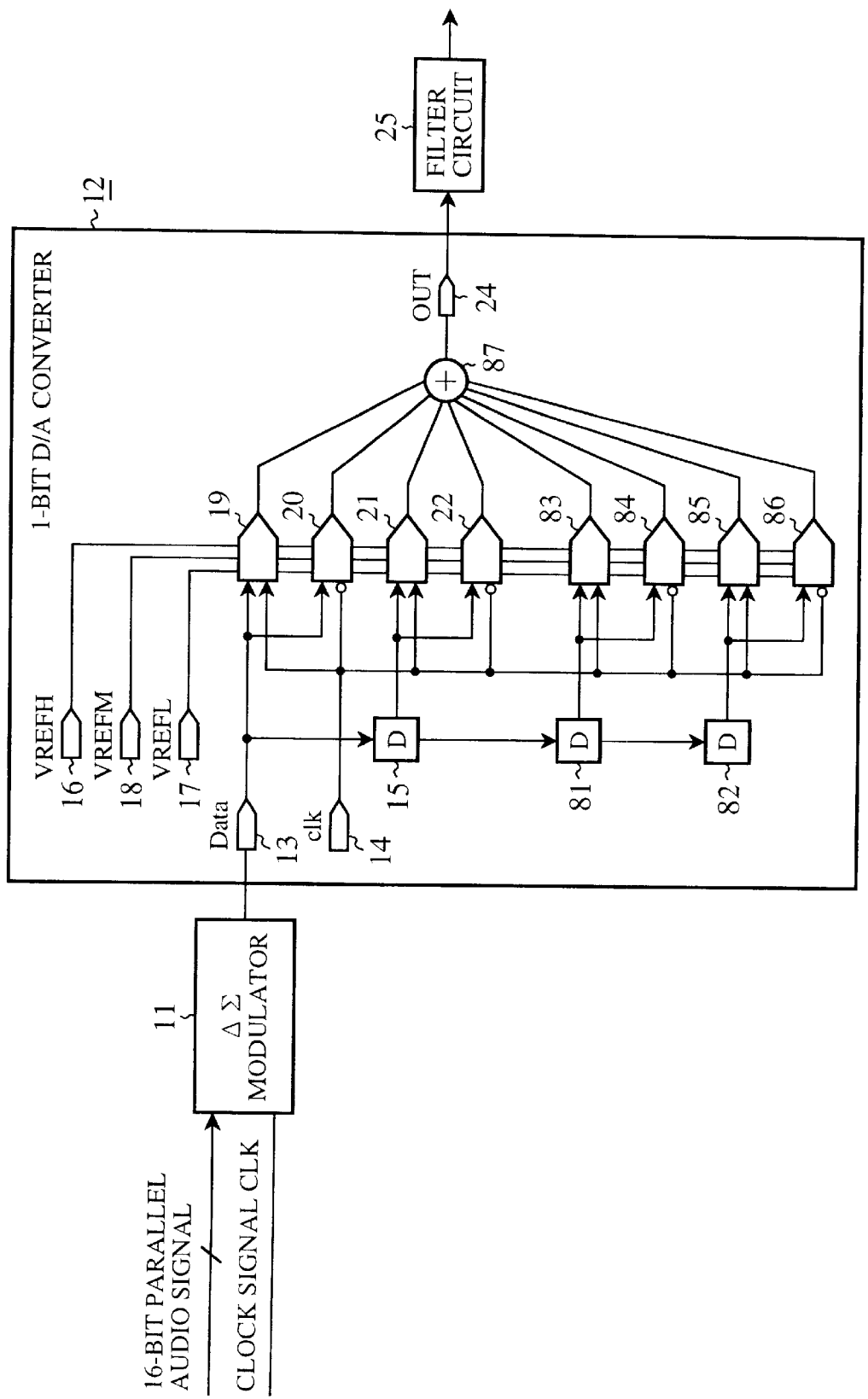
FIG. 6 is a block diagram showing a configuration of a part of audio equipment to which an embodiment 3 of the D/A converter in accordance with the present invention is applied.

FIG. 6 is a block diagram showing a configuration of a part of audio equipment to which an embodiment 3 of the D/A converter in accordance with the present invention is applied. In FIG. 6, the same reference numerals as those of FIG. 1 designate the same or like portions, and the description thereof is omitted here.

The reference numeral 81 designates a delay circuit for further delaying the 1-bit signal delayed by the delay circuit 15; and 82 designates a delay circuit for further delaying the 1-bit signal delayed by the delay circuit 81. The delay circuits 81 and 82 each hold the 1-bit signal for one period of the clock signal clk.

The reference numeral 83 designates a potential generator for generating the first reference potential VREFH, second reference potential VREFL or intermediate reference potential VREFM. More specifically, receiving the delayed 1-bit signal and clock signal clk from the delay circuit 81 and clock terminal 14, respectively, the potential generator 83 generates the first reference potential VREFH or second reference potential VREFL in response to the signal level of the 1-bit signal when the clock signal clk is at the high level, and generates the intermediate reference potential VREFM when the clock signal clk is at the low level. The reference numeral 84 designates a potential generator for generating the first reference potential VREFH, second reference potential VREFL or intermediate reference potential VREFM. More specifically, inverting the clock signal clk fed from the clock terminal 14, the potential generator 84 generates the first reference potential VREFH or second reference potential VREFL in response to the signal level of the delayed 1-bit signal fed from the delay circuit 81 when the inverted clock signal clk is at the high level, and generates the intermediate reference potential VREFM when the inverted clock signal clk is at the low level.

The reference numeral 85 designates a potential generator for generating the first reference potential VREFH, second reference potential VREFL or intermediate reference potential VREFM. More specifically, receiving the delayed 1-bit signal and clock signal clk from the delay circuit 82 and clock terminal 14, respectively, the potential generator 85 generates the first reference potential VREFH or second reference potential VREFL in response to the signal level of the 1-bit signal when the clock signal elk is at the high level, and generates the intermediate reference potential VREFM when the clock signal clk is at the low level. The reference numeral 86 designates a potential generator for generating the first reference potential VREFH, second reference potential VREFL or intermediate reference potential VREFM. More specifically, inverting the clock signal clk fed from the clock terminal 14, the potential generator 86 generates the first reference potential VREFH or second reference potential VREFL in response to the signal level of the delayed 1-bit signal fed from the delay circuit 82 when the inverted clock signal clk is at the high level, and generates the intermediate reference potential VREFM when the inverted clock signal clk is at the low level. The reference numeral 87 designates an adder for combining the potentials generated by the potential generators 19–22.

Although the foregoing embodiment 1 includes four potential generators, this is not essential. For example, the 1-bit D/A converter 12 can comprise 4N potential generators, where N is a natural number, presenting the similar advantages of the foregoing embodiment 1.

In FIG. 6, it includes the eight potential generators 19–22 and 83–86, and two additional delay circuits 81 and 82 besides the delay circuit 15 of FIG. 1.

When the number of the additional delay circuits is 2N, the total number of the potential generators is 4(N+1).

Embodiiment 4

Figure 7:
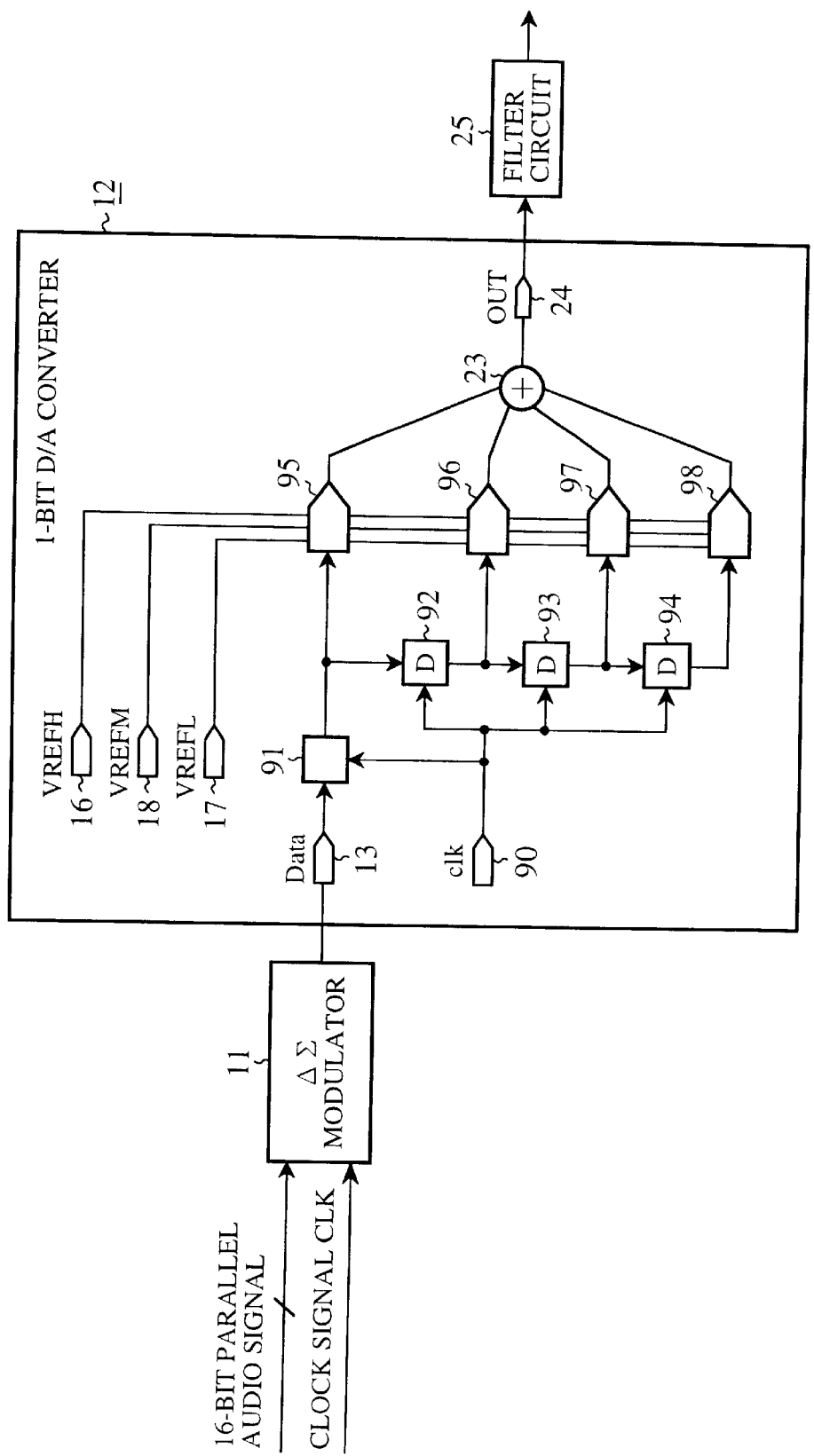
FIG. 7 is a block diagram showing a configuration of a part of audio equipment to which an embodiment 4 of the D/A converter in accordance with the present invention is applied.

FIG. 7 is a block diagram showing a configuration of a part of the audio equipment to which an embodiment 4 of the D/A converter in accordance with the present invention is applied. In FIG. 7, the same reference numerals as those of FIG. 1 designate the same or like portions, and the description thereof is omitted here.

The reference numeral 90 designates a clock terminal (input means) for inputting a clock signal clk with a rate twice that of the 1-bit signal input through the data terminal 13. The reference numeral 91 designates a double-rate sampler for outputting different level signals in the first and second half periods of the 1-bit signal in synchronization with the clock signal clk supplied from the clock terminal 90. During the first half of the 1-bit signal, the double-rate sampler 91 outputs a "1" or "−1" level signal in response to the signal level of the 1-bit signal. During the second half of the 1-bit signal, it outputs a "0" level signal. Although the double-rate sampler 91 outputs "1", "−1" or "0" level signal here, this is not essential. For example, it can output a combinational signal representing the "1", "−1" or "0" level.

Reference numerals 92–94 each designate a delay circuit for delaying the level signal output from the double-rate sampler 91. The reference numeral 95 designates a potential generator for receiving the level signal from the double-rate sampler 91, and for generating a potential in accordance with the level signal. Reference numerals 96–98 each designate a potential generator for receiving the level signal output from one of the delay circuits 92–94, and for generating the potential in accordance with the level signal.

Next, the operation of the present embodiment 4 will be described.

The present embodiment 4 differs from the foregoing embodiment 1 in that the clock terminal 90 receives the clock signal clk with the rate twice the data rate of the 1-bit signal input via the data terminal 13.

The double-rate sampler 91 outputs the "1"; "−1" or "0" level signal in synchronization with the clock signal clk supplied from the clock terminal 90. More specifically, during the first half of the 1-bit signal, it outputs the "1" level signal when the 1-bit signal is at the high level and the "−1" level signal when the 1-bit signal is at the low level as shown in FIG. 8. In contrast, it always outputs the "0" level signal during the second half of the 1-bit signal.

The delay circuit 92 delays the level signal output from the double-rate sampler 91, and the delay circuit 93 delays the level signal output from the delay circuit 92. Furthermore, the delay circuit 94 delays the level signal output from the delay circuit 93. Thus, the delay circuits 92–94 each receive the level signal, and hold it for one period of the clock signal clk before outputting it.

The potential generator 95, receiving the level signal from the double-rate sampler 91, generates the potential corresponding to the level signal as shown in FIG. 8.

More specifically, the potential generator 95 generates the first reference potential VREFH when the level signal is "1", the second reference potential VREFL when it is "−1", and the intermediate reference potential VREFM when it is "0".

The potential generators 96–98 each receive one of the level signals output from the delay circuits 92–94, and outputs the potential corresponding to the level signal in the same manner as the potential generator 95.

The adder 23 combines the potentials generated by the potential generators 95–98 by summing them up as in the foregoing embodiment 1.

As the foregoing embodiment 1, the present embodiment 4 can also cancel out the fluctuations at the rising edges and falling edges of the waveforms, thereby eliminating the effect of the potential variations from the combined signal the adder 23 outputs.

Thus, the present embodiment 4 offers the following advantage in addition to the advantage of the foregoing embodiment 1 that it can improve the jitter tolerance.

Figure 9A:
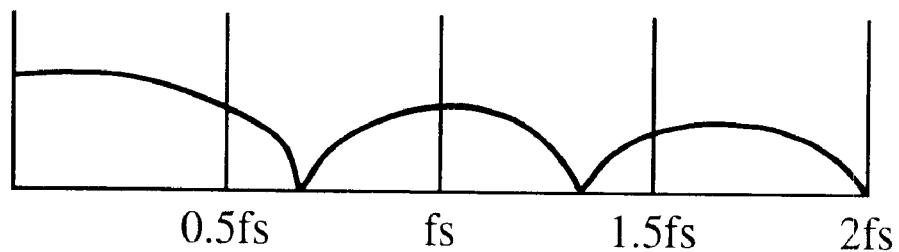
FIGS. 9A and 9B are diagrams illustrating frequency characteristics and the like of the output signal of the 1-bit D/A converter.

More specifically, although the foregoing embodiment 1 has no problem when the duty of the clock signal clk is 50% because the delay circuit 15 delays the 1-bit signal by half the period, if the duty deviates from the ideal 50% because of the characteristics of a clock signal generator not shown, it has the following problem. For example, when the duty is 75%, the frequency characteristics of the output signal of the 1-bit D/A converter 12 are not as illustrated in FIG. 2C, but become as illustrated in FIG. 9A. This presents a problem in that large noise component remains around the frequency 0.5 fs.

Figure 9B:
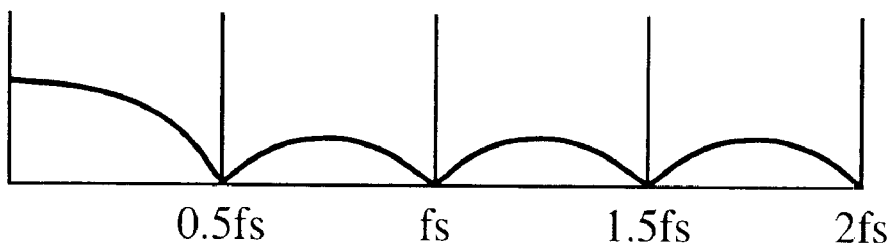

In contrast with this, the present embodiment 4 enables the double-rate sampler 91 and delay circuits 92–94 to handle the one period of the 1-bit signal instead of half the period by inputting the clock signal clk with twice the rate of the 1-bit signal through the clock terminal 90. Therefore the present embodiment 4 is free from the effect of the duty of the clock signal clk. Accordingly, the clock signal clk with the duty of 75% does not bring about the noise component around the frequency 0.5 fs, because the frequency characteristics of the output signal of the 1-bit D/A converter 12 become as shown in FIG. 9B in this case.

Although the present embodiment 4 includes three delay circuits and four potential generators, this is not essential. For example, it can comprise 4N−1 delay circuits and 4N potential generators, where N is an integer, achieving the same advantages.

Embodiment 5

Figure 10:
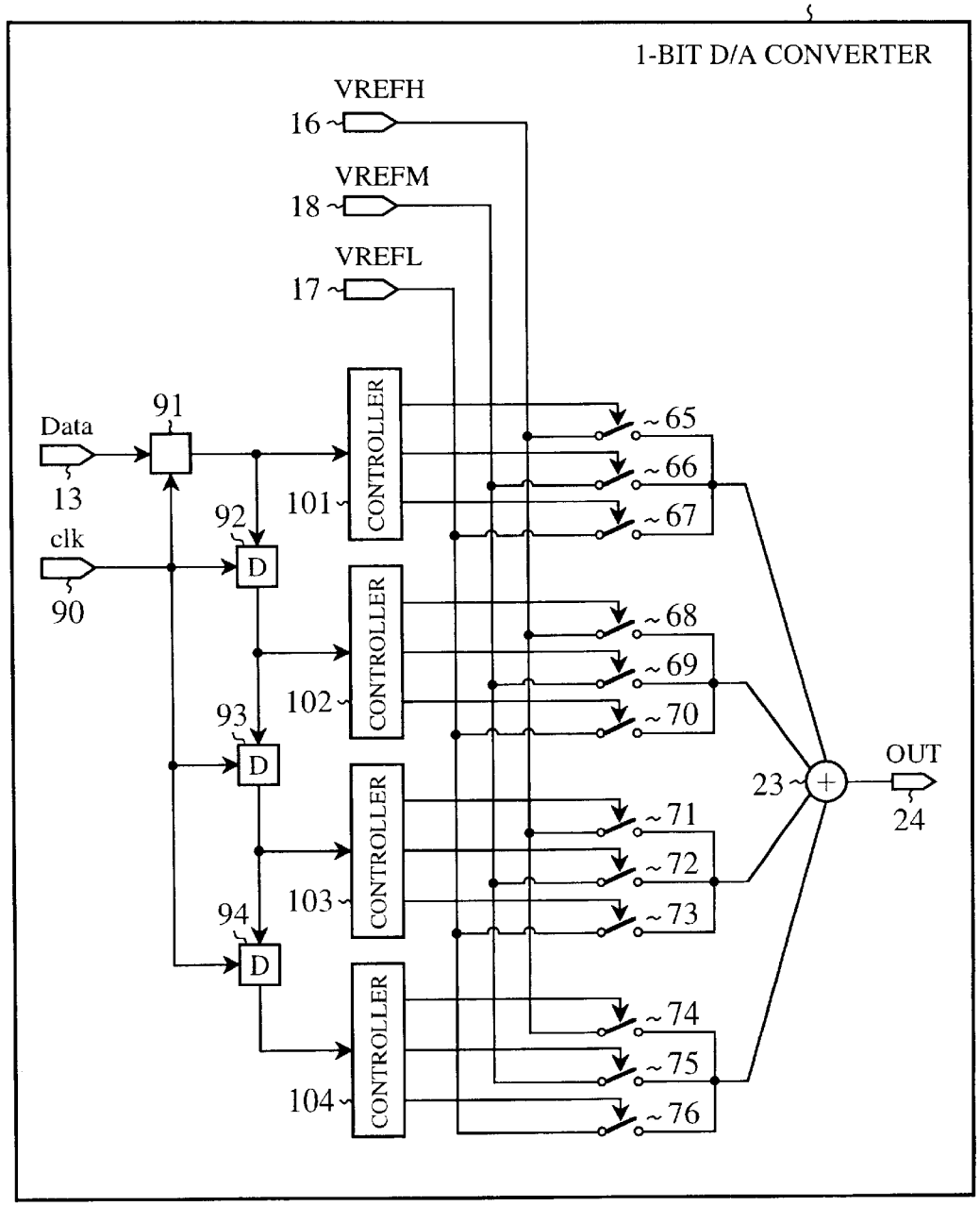
FIG. 10 is a circuit diagram showing a detailed configuration of the potential generators of the 1-bit D/A converter.

FIG. 10 is a circuit diagram showing a detailed configuration of potential generators 95–98 of the 1-bit D/A converter 12. In FIG. 10, the same reference numerals as those of FIGS. 5 and 7 designate the same or like portions, and the description thereof is omitted here.

The reference numeral 101 designates a controller for bringing only the transistor 65 into conduction when it receives the "1" level signal from the double-rate sampler 91, only the transistor 67 into conduction when it receives the "−1" level signal, and only the transistor 66 into conduction when it receives the "0" level signal; 102 designates a controller for bringing only the transistor 68 into conduction when it receives the "1" level signal from the delay circuit 92, only the transistor 70 into conduction when it receives the "−1" level signal, and only the transistor 69 into conduction when it receives the "0" level signal; 103 designates a controller for bringing only the transistor 71 into conduction when it receives the "1" level signal from the delay circuit 93, only the transistor 73 into conduction when it receives the "−1" level signal, and only the transistor 72 into conduction when it receives the "0" level signal; and 104 designates a controller for bringing only the transistor 74 into conduction when it receives the "1" level signal from the delay circuit 94, only the transistor 76 into conduction when it receives the "−1" level signal, and only the transistor 75 into conduction when it receives the "0" level signal.

Next, the operation of the present embodiment 5 will be described.

The controller 101 and transistors 65–67 correspond to the potential generator 95. Receiving the "1" level signal from the double-rate sampler 91, the controller 101 turns on the transistor 65, and turns off the transistors 66 and 67, thereby supplying the first reference potential VREFH to the adder 23.

Receiving the "−1" level signal from the double-rate sampler 91, the controller 101 turns on the transistor 67, and turns off the transistors 65 and 66, thereby supplying the second reference potential VREFL to the adder 23.

Receiving the "0" level signal from the double-rate sampler 91, the controller 101 turns on the transistor 66, and turns off the transistors 65 and 67, thereby supplying the intermediate reference potential VREFM to the adder 23.

The controller 102 and transistor 68–70, the controller 103 and transistors 71–73 and the controller 104 and transistors 74–76 corresponding to the potential generators 96, 97 and 98 operate in the same manner as the controller 101 and transistors 65–67 corresponding to the potential generator 95. Thus, the description of the operation thereof is omitted here.

The present embodiment 5 offers an advantage of being able to construct the potential generators 96–98 with simple configurations.

Figure 11:
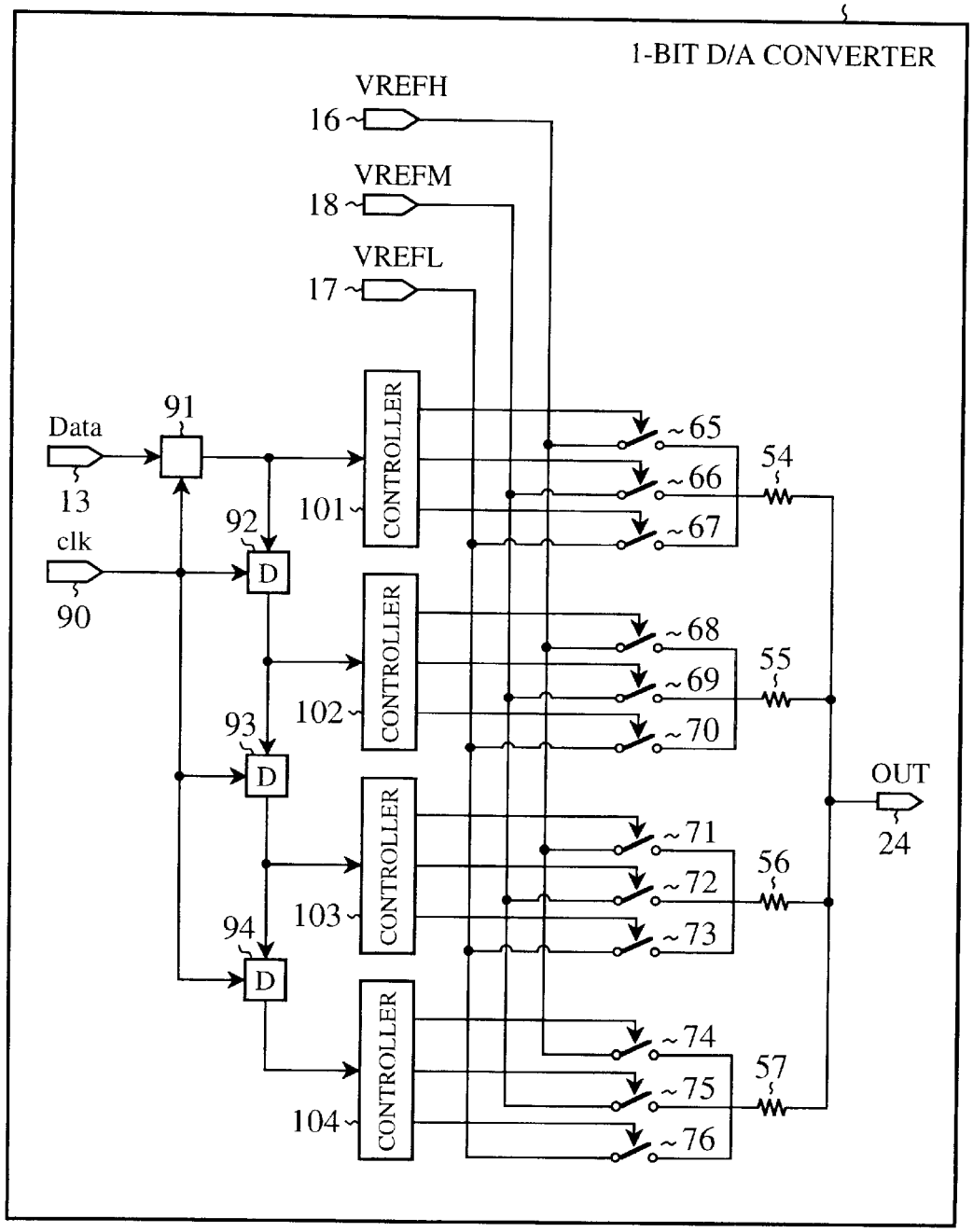
FIG. 11 is a circuit diagram showing another detailed configuration of the potential generators of the 1-bit D/A converter.

Although the adder 23 sums up the plurality of potentials in the example of FIG. 10, this is not essential. For example, resistors 54–57 as shown in FIG. 11 can constitute the adder 23 so that they convert the potentials output from the potential generators 95–98 into currents, and then sum up the currents.

Embodiment 6

Figure 12:
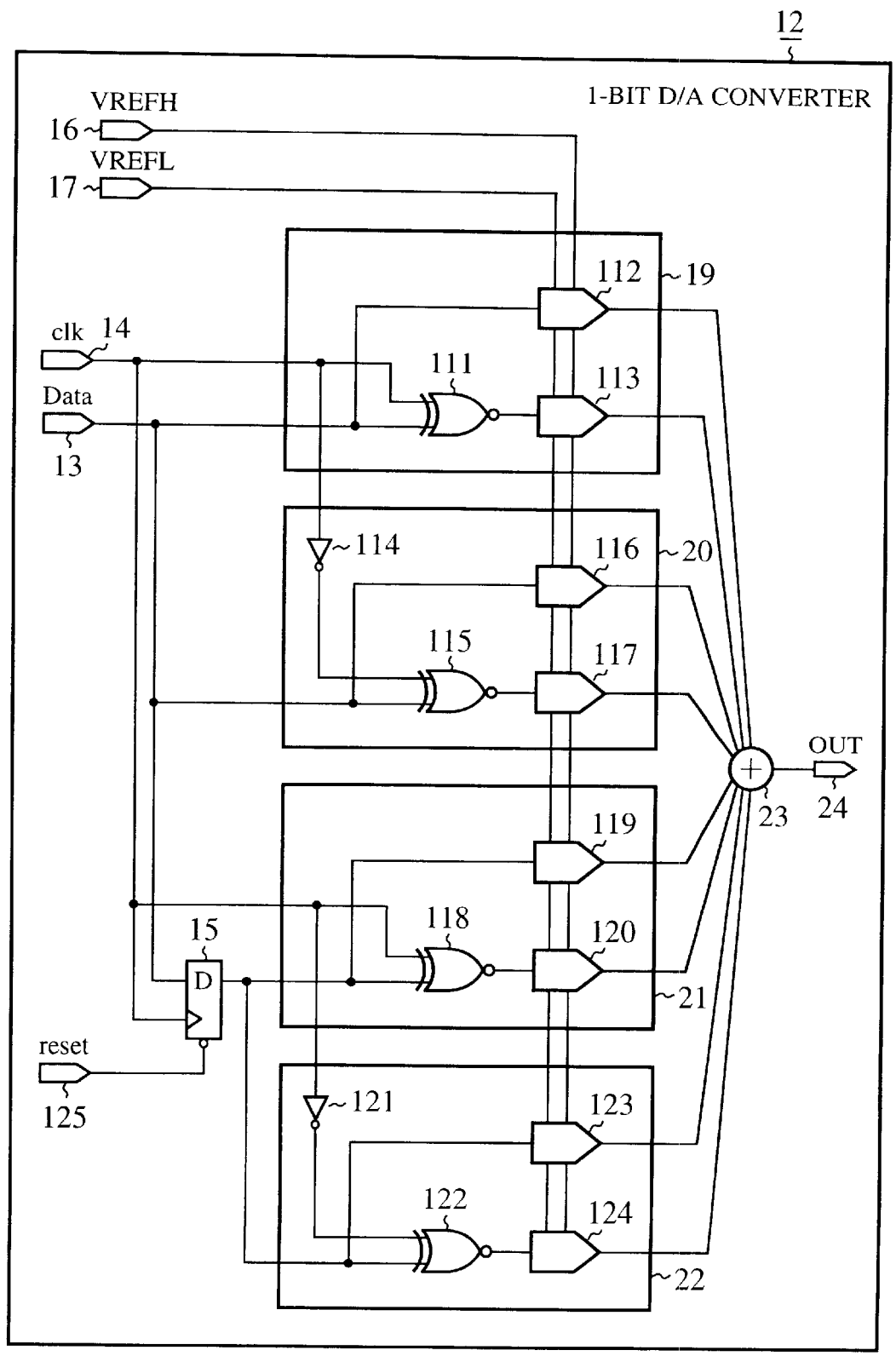
FIG. 12 is a circuit diagram showing a detailed configuration of the potential generators of the 1-bit D/A converter.

FIG. 12 is a block diagram showing a detailed configuration of the potential generators 19–22 of the 1-bit D/A converter 12. In FIG. 12, the same reference numerals as those of FIG. 1 designate the same or like portions, and the description thereof is omitted here.

Reference numerals 111, 115, 118 and 122 each designate an exclusive-NOR circuit for producing the exclusive-NOR between the 1-bit signal and the clock signal clk; 114 and 121 each designate an inverter for inverting the clock signal clk; 112, 116, 119 and 123 each designate a potential generator for generating the first reference potential VREFH when the 1-bit signal is at the high level, and the second reference potential VREFL when the 1-bit signal is at the low level; 113, 117, 120 and 124 each designate a potential generator for generating the first reference potential VREFH when the output signal of the corresponding one of the exclusive-NOR circuits 111, 115, 118 and 122 is at the high level, and the second reference potential VREFL when the output signal is at the low level; and 125 designate an input terminal for inputting a reset signal.

Although the foregoing embodiment 1 has the potential input terminal 18 for inputting the intermediate reference potential VREFM in addition to the potential input terminals 16 and 17, the potential input terminal 18 can be omitted.

To achieve this, the potential generators 19–22 can be configured as shown in FIG. 12.

The operation of the potential generator 19, for example, is as follows. First, the exclusive-NOR circuit 111 produces the exclusive-NOR between the 1-bit signal and the clock signal clk. Accordingly, when the clock signal clk is at the high level, the potential generator 113 generates the first reference potential VREFH when the 1-bit signal is at the high level, and the second reference potential VREFL when the 1-bit signal is at the low level.

In this case, the potential generator 112 also generates the first reference potential VREFH when the 1-bit signal is at the high level, and the second reference potential VREFL when the 1-bit signal is at the low level.

Thus, when the clock signal clk is at the high level, both the potential generators 112 and 113 supply the same potential to the adder 23. Consequently, the adder 23, which calculates the first reference potential VREFH+first reference potential VREFH, or the second reference potential VREFL+second reference potential VREFL in this case, outputs the 2VREFH or 2VREFL (called "first calculation result" from now on).

On the other hand, when the clock signal clk is at the low level, the potential generator 113 generates the second reference potential VREFL when the 1-bit signal is at the high level, and the first reference potential VREFH when the 1-bit signal is at the low level.

In contrast, the potential generator 112 generates the first reference potential VREFH when the 1-bit signal is at the high level, and the second reference potential VREFL when the 1-bit signal is at the low level.

Thus, when the clock signal clk is at the low level, the potential generators 112 and 113 supply the different potentials to the adder 23. Consequently, the adder 23, which calculates the second reference potential VREFL+first reference potential VREFH, or the first reference potential VREFH+second reference potential VREFL in this case, outputs the VREFH+VREFL as the calculation result (called "second calculation result" from now on).

Comparing the first calculation result with the second calculation result, the second calculation result corresponds to the intermediate value of the first calculation result. Accordingly, the second calculation result corresponds to double the intermediate reference potential 2VREFM.

Therefore the intermediate reference potential can be generated without the potential input terminal 18 for supplying it. Thus, the present embodiment 6 can simplify the circuit configuration by that amount.

Figure 13:
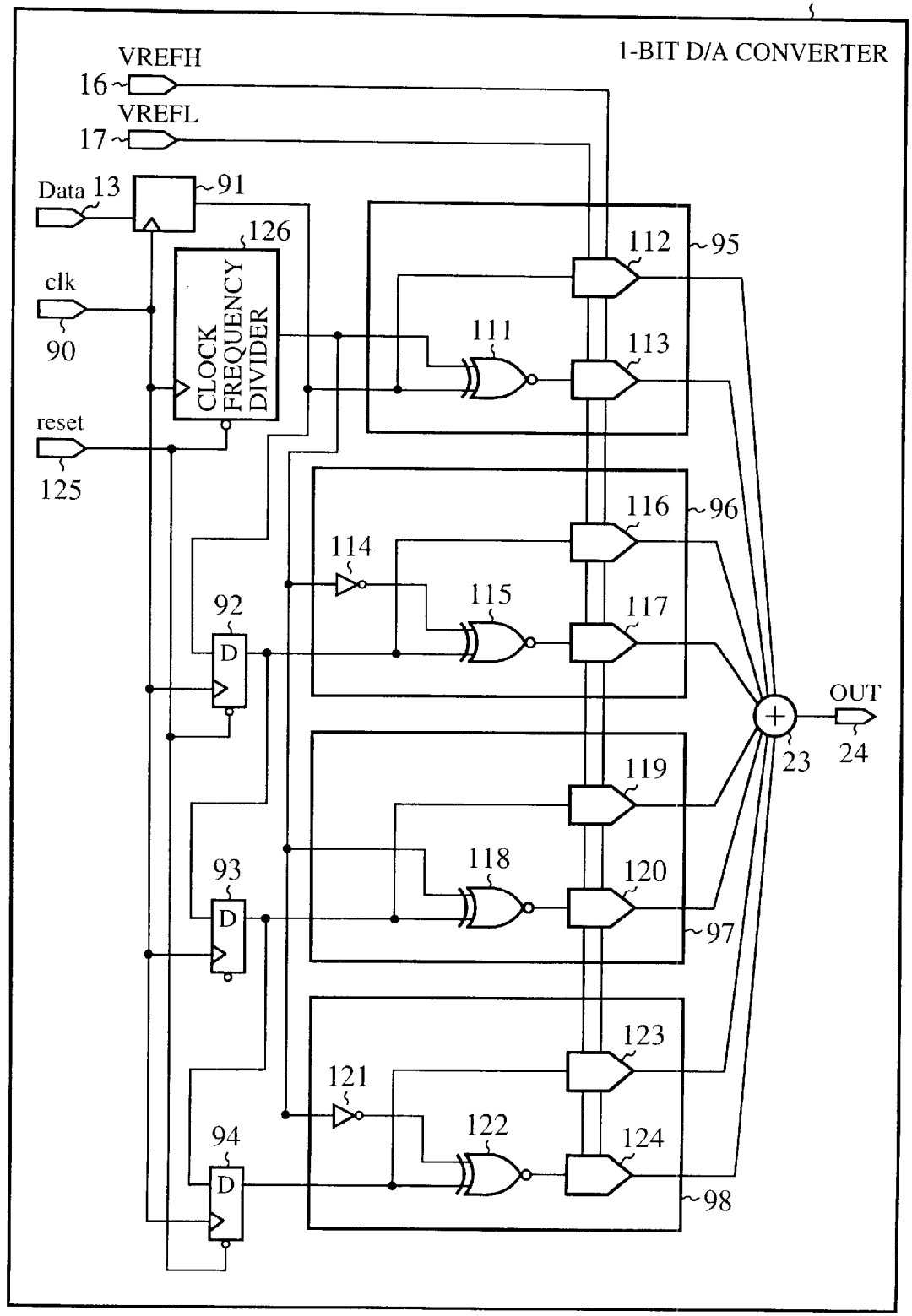
FIG. 13 is a circuit diagram showing a detailed configuration of the potential generators of the 1-bit D/A converter.

Although FIG. 12 shows the detailed configuration of the potential generators 19–22 corresponding to those of FIG. 1, FIG. 13 shows a detailed configuration of the potential generators 95–98 corresponding to those of the foregoing embodiment 4 as shown in FIG. 7. In this case, the potential input terminal 18 for inputting the intermediate reference potential VREFM can also be omitted. In FIG. 13, the reference numeral 126 designates a frequency divider for dividing the frequency of the clock signal clk.

Embodiment 7

Figure 14:
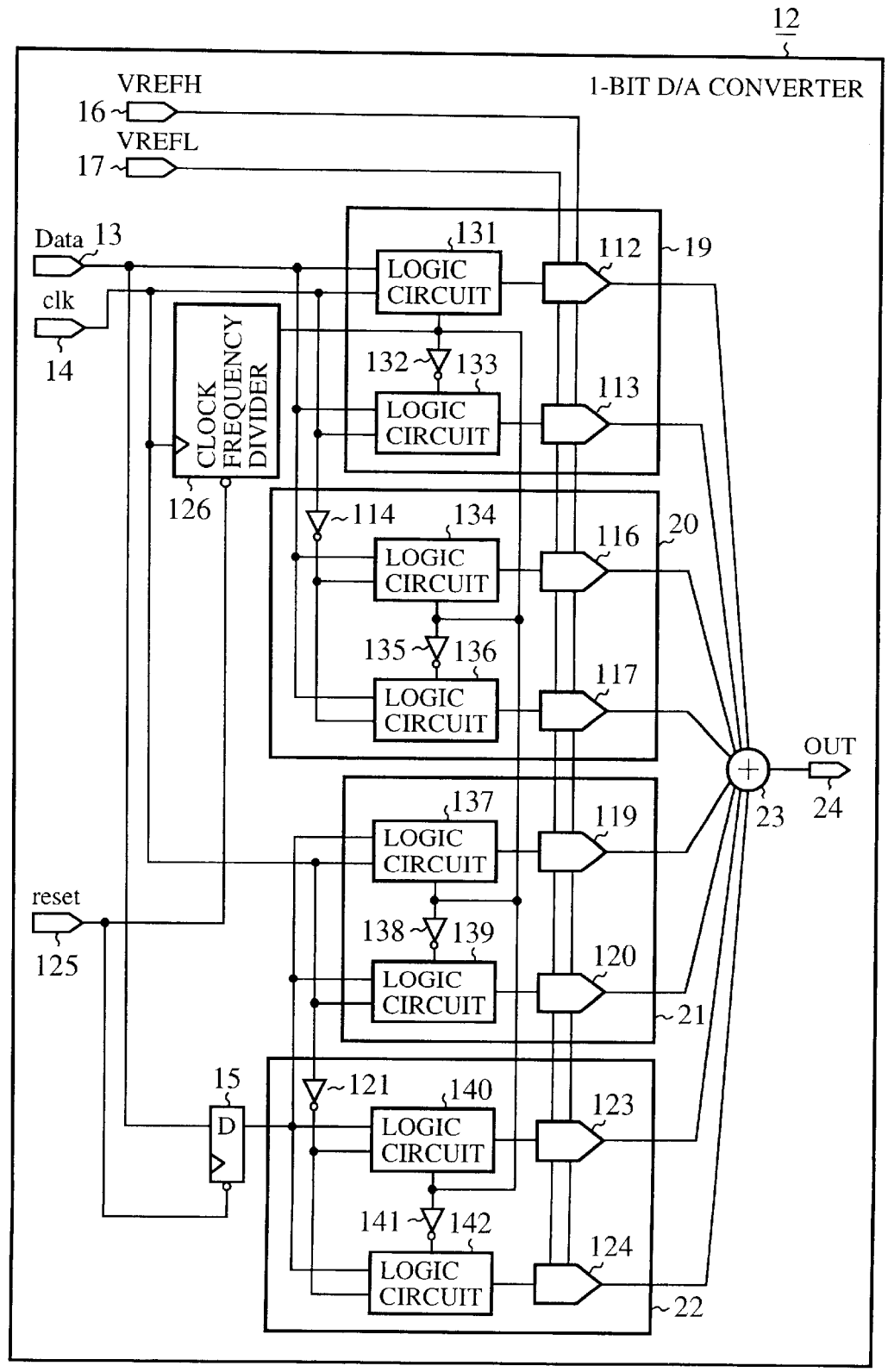
FIG. 14 is a circuit diagram showing a detailed configuration of the potential generators of the 1-bit D/A converter.

FIG. 14 is a block diagram showing a detailed configuration of the potential generators 19–22 of the 1-bit D/A converter 12. In FIG. 14, the same reference numerals as those of FIGS. 12 and 13 designate the same or like portions, and the description thereof is omitted here.

Reference numerals 131, 134, 137 and 140 each designate a logic circuit for outputting the 1-bit signal without change when the frequency-divided clock signal output from the clock frequency divider 126 is at the high level, and for producing the exclusive-NOR between the 1-bit signal and clock signal clk when the frequency-divided clock signal is at the low level; 132, 135, 138 and 141 each designate an inverter for inverting the frequency-divided clock signal output from the clock frequency divider 126; and 133, 136, 139 and 142 each designate a logic circuit for outputting the 1-bit signal without change when the inverted frequency-divided clock signal output from the corresponding one of the inverters 132, 135, 138 and 141 is at the high level, and for producing the exclusive-NOR between the 1-bit signal and the clock signal clk when the inverted frequency-divided clock signal is at the low level.

Figure 15:
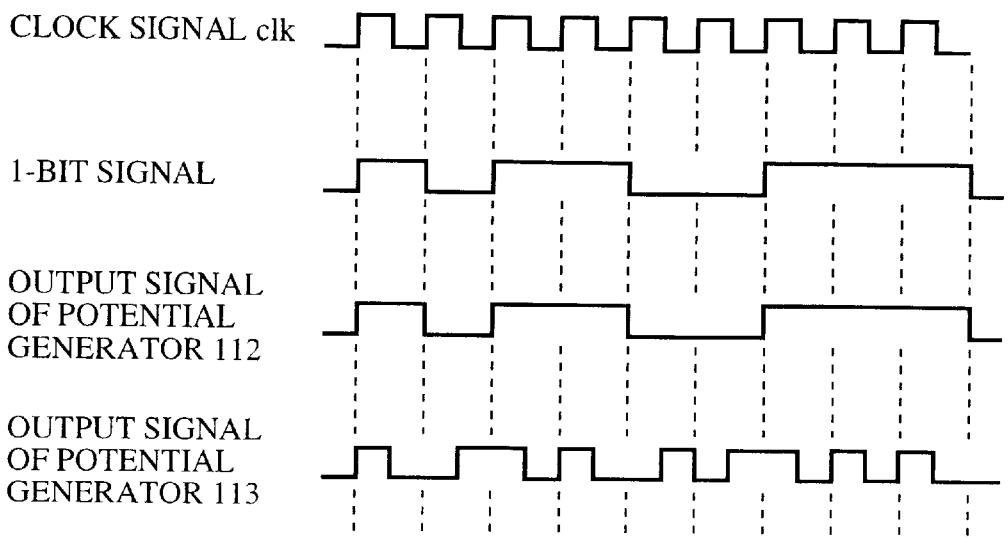
FIG. 15 is a diagram illustrating waveforms of various signals of FIG. 12 or 13.

Comparing the number of the potential transitions of the potential generator 112 with that of the potential generator 113 of the potential generator 19 in the foregoing embodiment 6, for example, the latter is much greater than the former as illustrated in FIG. 15.

Accordingly, when a mismatch occurs between the potential generator 112 and potential generator 113, signals outside the band can be folded over the band as a spurious signal.

Figure 16:
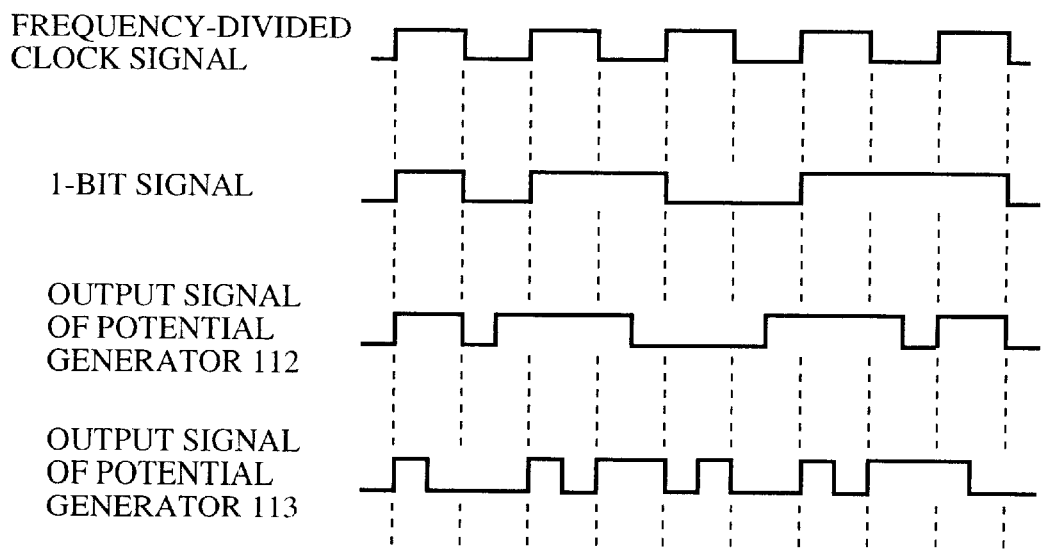
FIG. 16 is a diagram illustrating waveforms of various signals of FIG. 14.

In view of this, to bring the number of transitions of the potential generator 112 nearer to that of the potential generator 113 as illustrated in FIG. 16, the present embodiment 7 is configured such that the logic circuit 131 and logic circuit 133 carry out the processing alternately.

More specifically, the logic circuit 131 outputs the 1-bit signal as it is when the frequency-divided clock signal output from the clock frequency divider 126 is at the high level, and produces the exclusive-NOR between the 1-bit signal and the clock signal clk when the frequency-divided clock signal is at the low level.

In contrast, the logic circuit 133 produces the exclusive-NOR between the 1-bit signal and the clock signal clk when the frequency-divided clock signal output from the clock frequency divider 126 is at the high level (that is, when the inverted frequency-divided clock signal output from the inverter 132 is at the low level), and outputs the 1-bit signal without change when the frequency-divided clock signal is at the low level (that is, when the inverted frequency-divided clock signal output from the inverter 132 is at the high level).

Thus the present embodiment 7 offers an advantage of being able to reduce the spurious signal.

Figure 17:
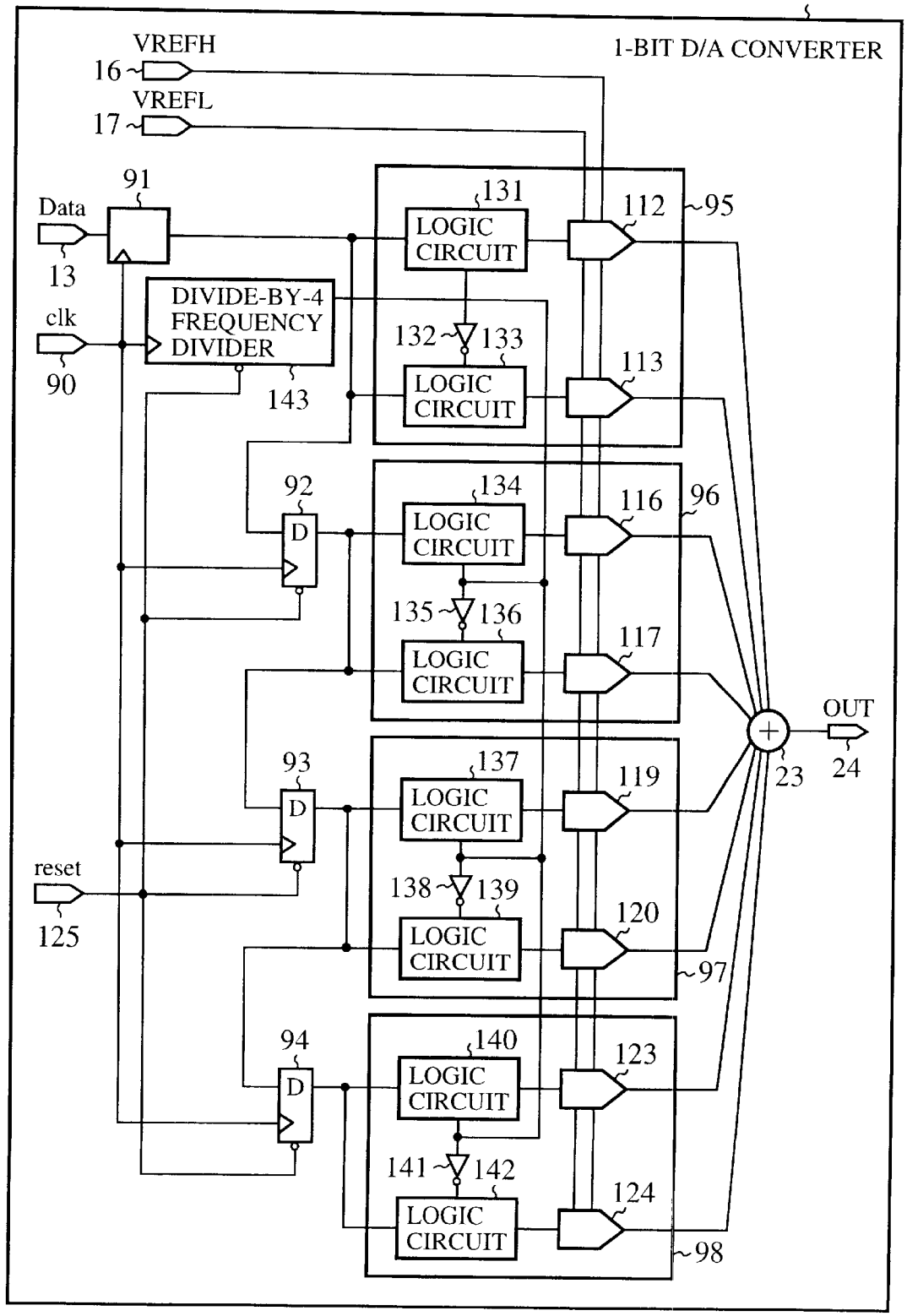
FIG. 17 is a circuit diagram showing a detailed configuration of the potential generators of the 1-bit D/A converter.

Although FIG. 14 shows the detailed configuration of the potential generators 19–22 corresponding to those of FIG. 1, FIG. 17 shows a detailed configuration of the potential generators 95–98 corresponding to those of the foregoing embodiment 4 as shown in FIG. 7. In this case, the potential input terminal 18 for inputting the intermediate reference potential VREFM can also be omitted, in addition to the advantage of being able to reduce the spurious signal. In FIG. 17, the reference numeral 143 designates a divide-by-4 frequency divider for dividing the clock signal clk by four.

Embodiment 8

Figure 18:
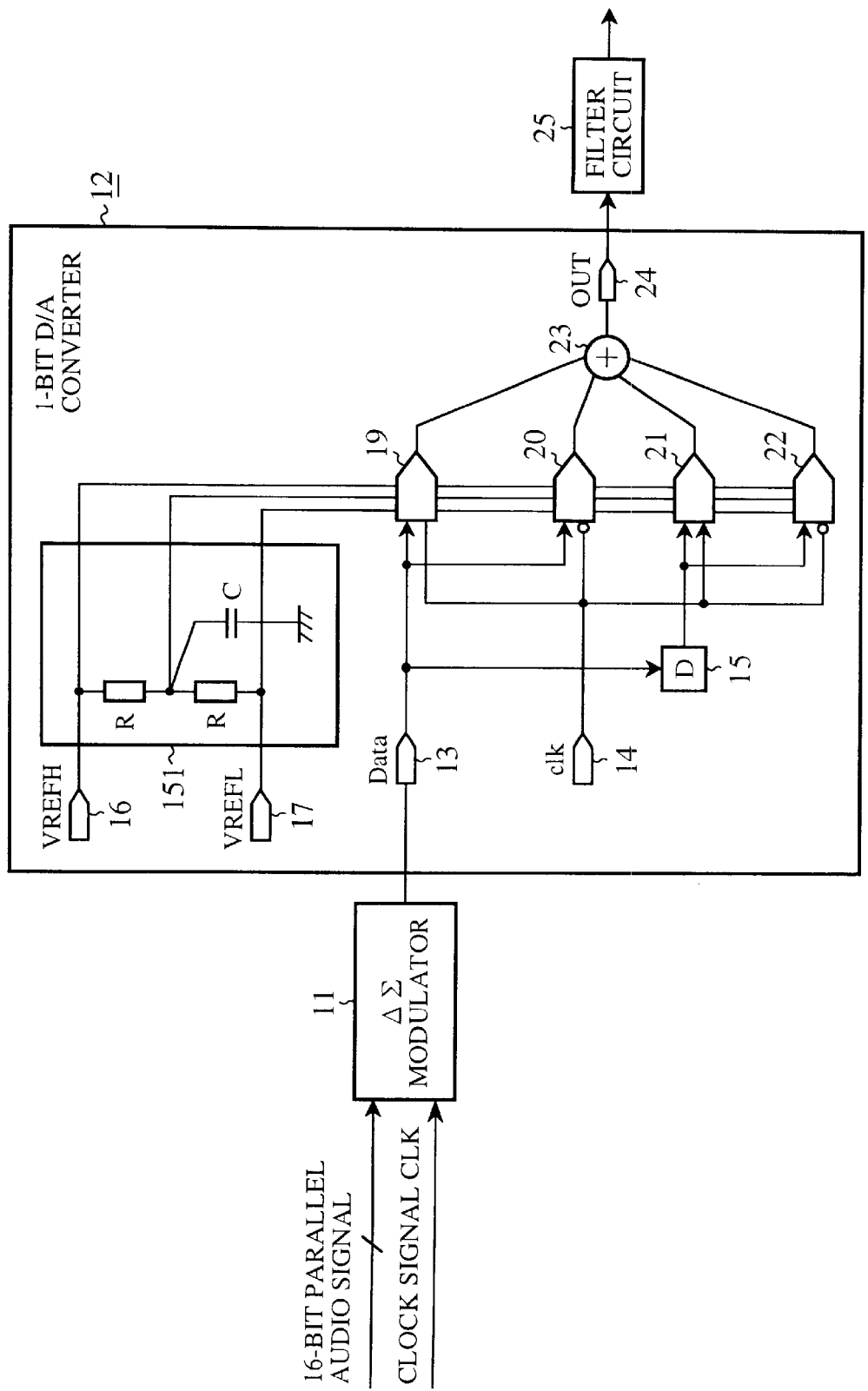
FIG. 18 is a block diagram showing a configuration of a part of audio equipment to which an embodiment 8 of the D/A converter in accordance with the present invention is applied.
Figure 19:
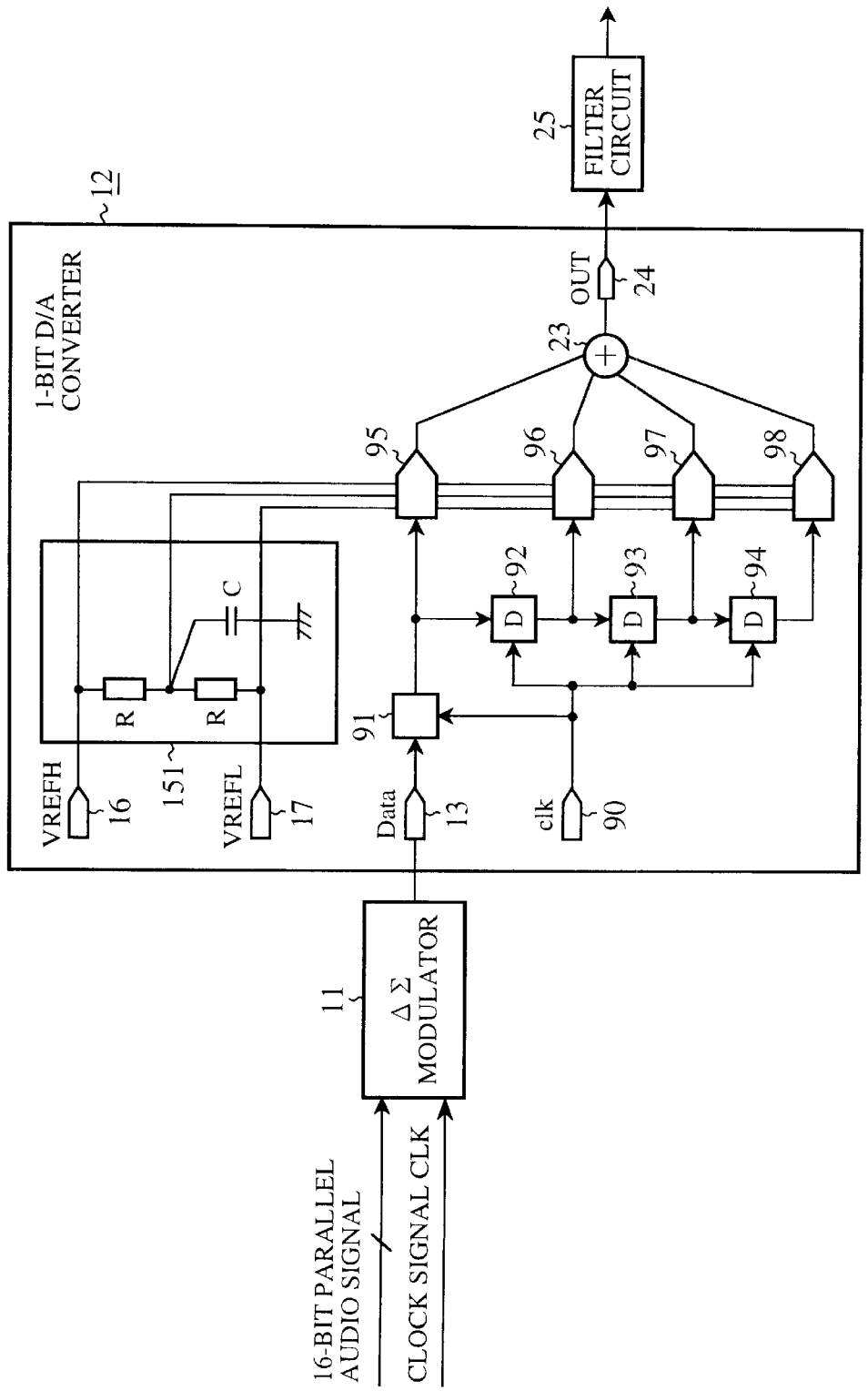
FIG. 19 is a block diagram showing another configuration of a part of the audio equipment to which the embodiment 8 of the D/A converter in accordance with the present invention is applied.

Although the foregoing embodiments 1–5 include the potential input terminal 18 for inputting the intermediate reference potential VREFM in addition to the potential input terminals 16 and 17, this is not essential. For example, as shown in FIGS. 18 and 19, it is possible to remove the potential input terminal 18 by adding an intermediate reference potential generator 151 for generating the intermediate reference potential VREFM from the first reference potential VREFH and second reference potential VREFL.

In this case, if the two resistors R constituting the intermediate reference potential generator 151 have an identical value, it can generate the intermediate reference potential VREFM accurately. However, if the two resistors R differ slightly, it will generate a potential slightly deviated from the middle between the first reference potential VREFH and second reference potential VREFL.

Figure 20:
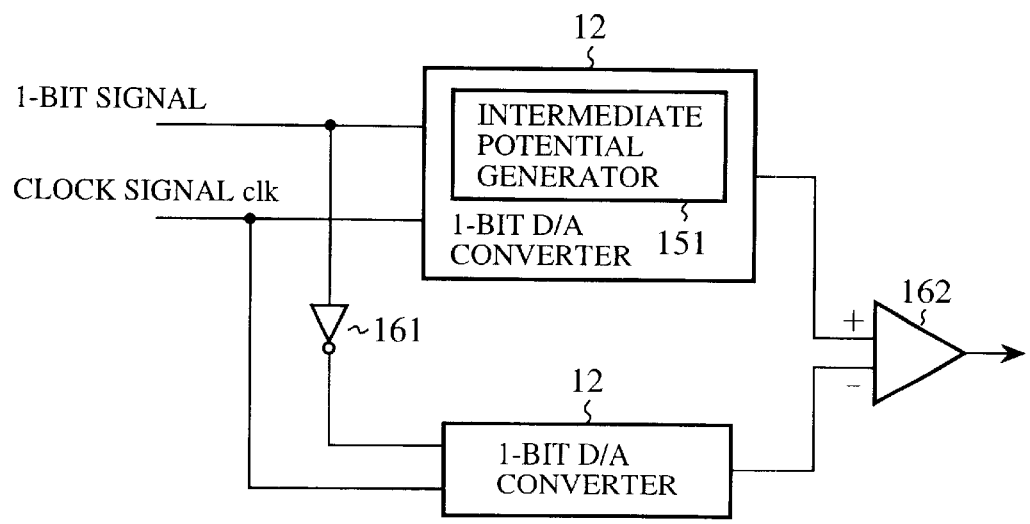
FIG. 20 is a block diagram showing a configuration of a part of the audio equipment to which the embodiment 8 of the D/A converter in accordance with the present invention is applied.

In view of this, the present embodiment 8 is configured such that it comprises the first 1-bit D/A converter 12 as shown in FIG. 1 or 7 and the second 1-bit D/A converter 12 including the intermediate reference potential generator 151, which are connected in parallel as shown in FIG. 20. The first 1-bit D/A converter 12 is supplied with the inverted 1-bit signal via an inverter 161.

Then, a subtracter 162 subtracts the output signal of the first 1-bit D/A converter 12 from the output signal of the second 1-bit D/A converter 12.

This makes it possible for the subtracter 162 to compensate for the intermediate reference potential VREFM output from the two 1-bit D/A converters 12 even if the two resistors R differ slightly, thereby eliminating the deviation of the intermediate reference potential VREFM.

Figure 21:
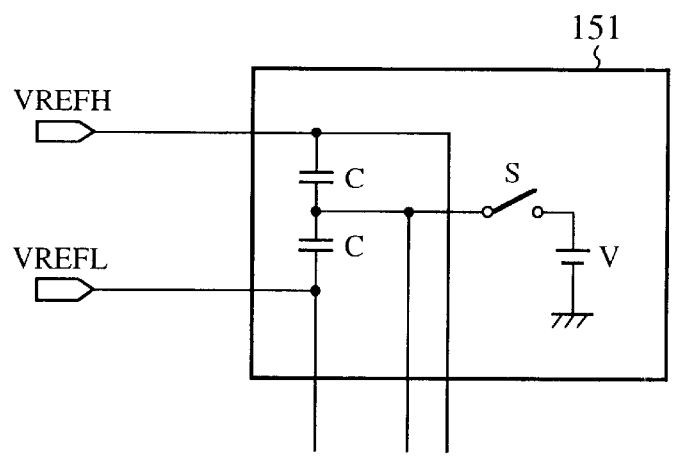
FIG. 21 is a circuit diagram showing a configuration of an intermediate reference potential generator 151.

Although the present embodiment 8 construct the intermediate reference potential generator 151 from the two resistors R and a capacitor C, this is not essential. For example, it can be constructed from the two capacitors, a switch and a battery V as shown in FIG. 21. The switch S is turned on only at the initialization of the 1-bit D/A converter 12, and is maintained at the off state in the normal operation.

Embodiment 9

Figure 22:
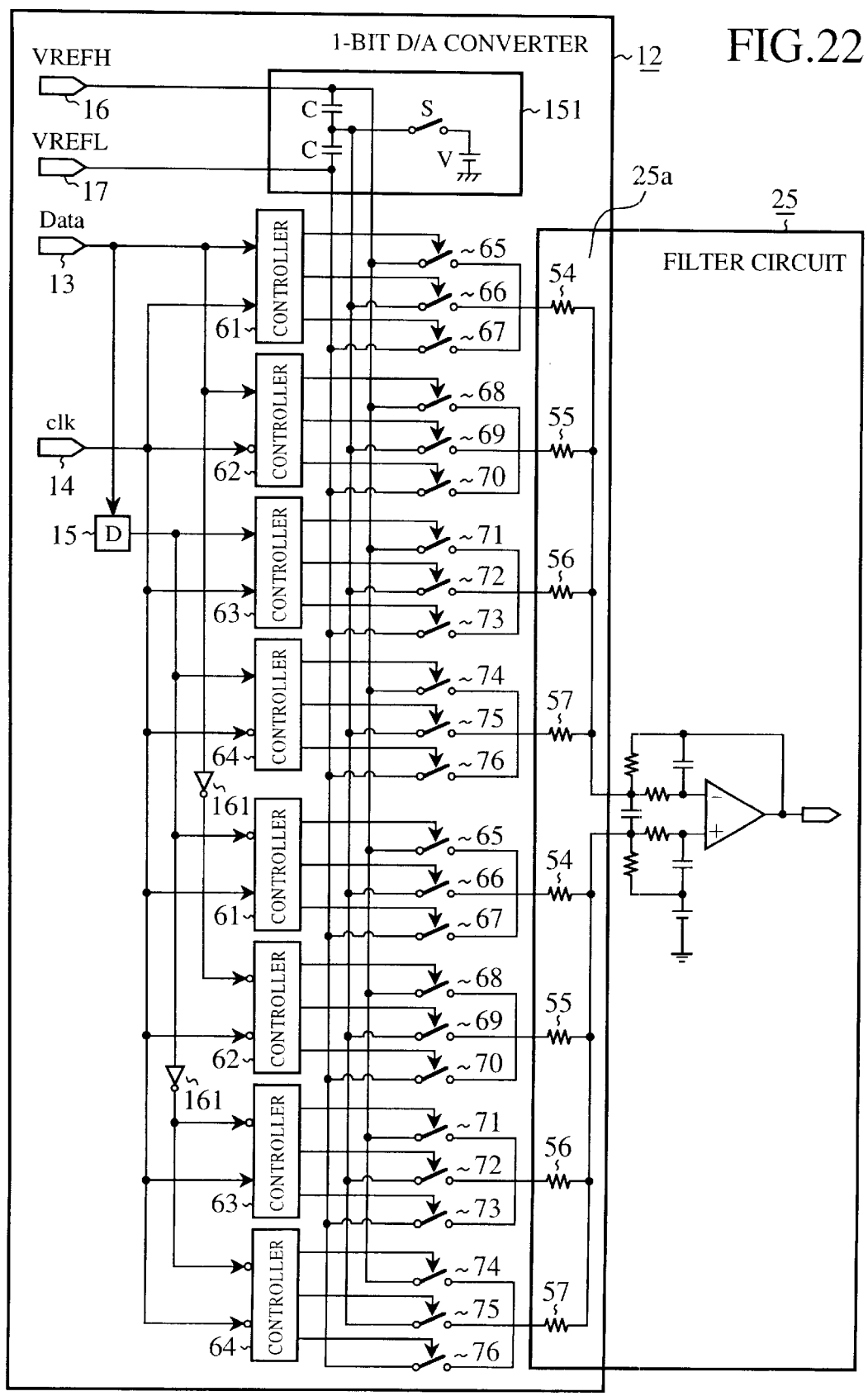
FIG. 22 is a block diagram showing a configuration of a part of audio equipment to which an embodiment 9 of the D/A converter in accordance with the present invention is applied.
Figure 23:
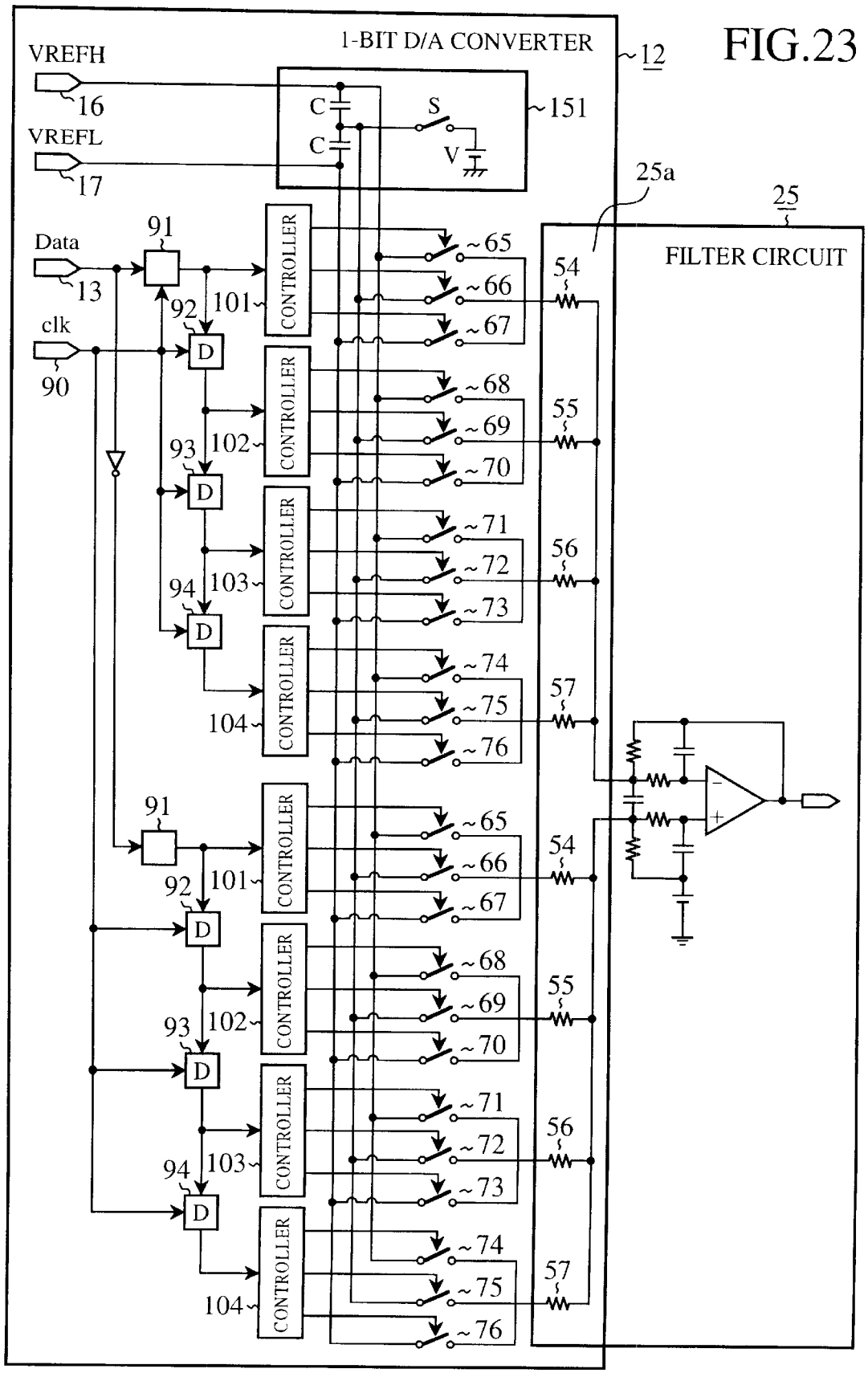
FIG. 23 is a block diagram showing another configuration of a part of the audio equipment to which the embodiment 9 of the D/A converter in accordance with the present invention is applied.
Figure 24:
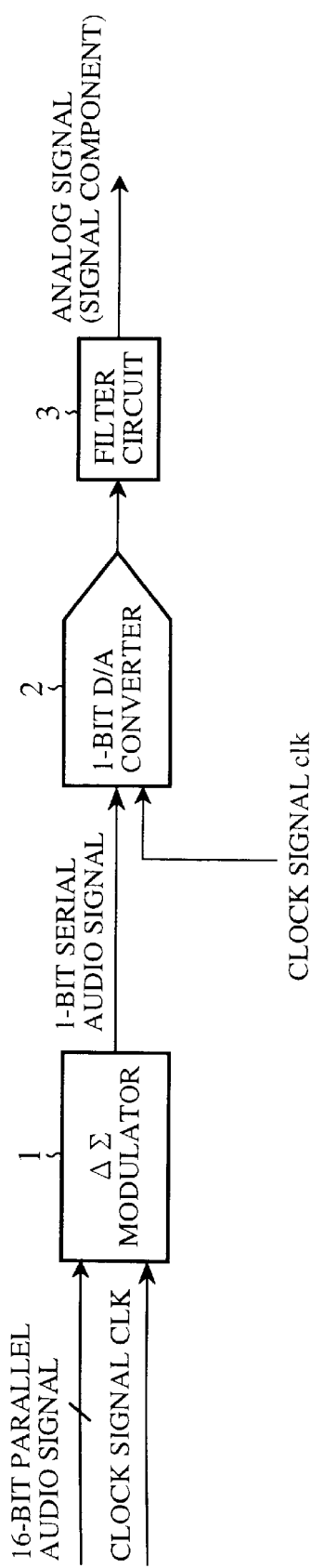
FIG. 24 is a block diagram showing a configuration of a part of audio equipment to which a conventional D/A converter is applied.
Figure 25A:
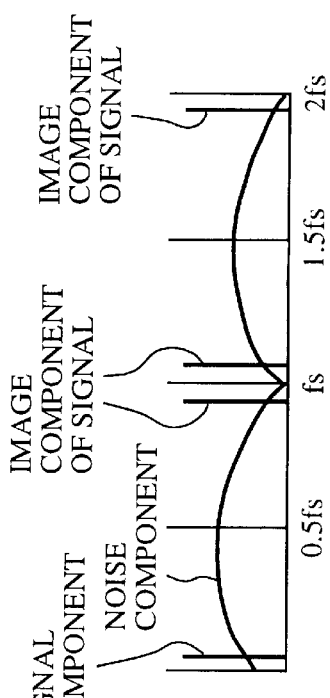
FIGS. 25A and 25B are diagrams illustrating frequency characteristics and the like of a 1-bit signal.
Figure 25B:
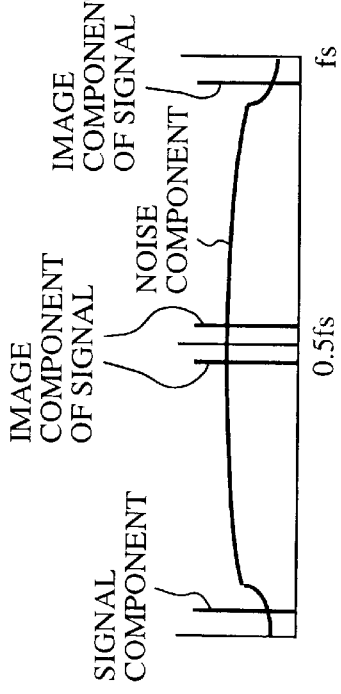
Figure 26:
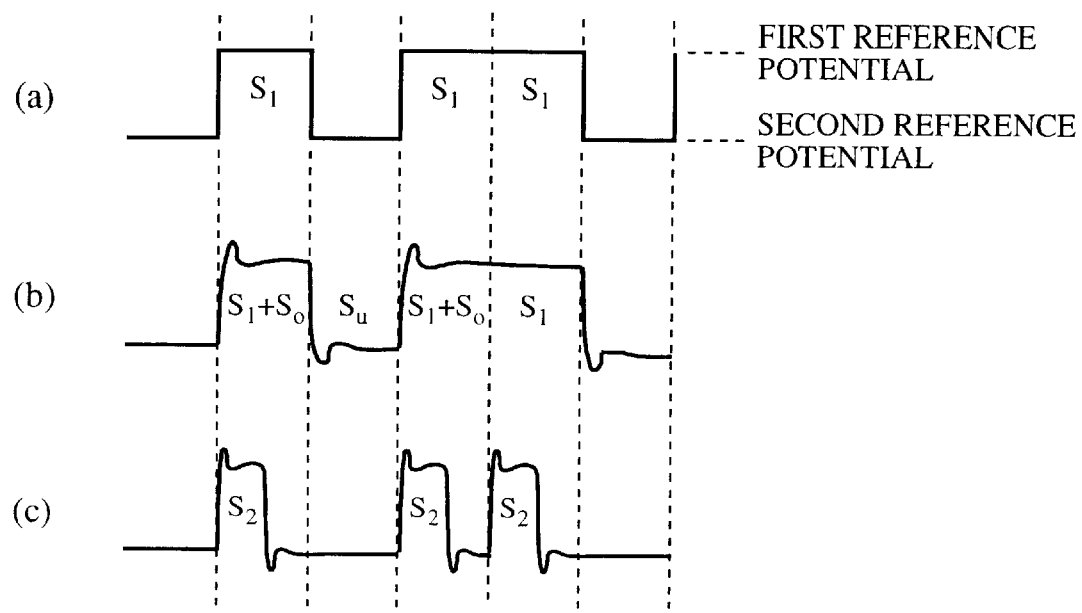
FIG. 26 is a diagram illustrating the output signals of the 1-bit D/A converter.

Although the two 1-bit D/A converters 12 are connected in parallel in the foregoing embodiment 8, other configurations are also possible. For example, when the adder 23 of the 1-bit D/A converter 12 is composed of the resistors 54–57 as shown in FIGS. 4 and 10, the resistors constituting the input section 25a of the filter circuit 25 can share the function of the resistors 54–57 of the adder as shown in FIGS. 22 and 23.

Thus, the present embodiment 9 offers an advantage of being able to simplify the circuit configuration of the 1-bit D/A converter 12.

What is claimed is:

1. A D/A converter comprising:

input means for inputting a 1-bit signal and a clock signal;

first delay means for delaying the 1-bit signal supplied from said input means;

inverting means for inverting the clock signal supplied from said input means;

first potential generating means for receiving the 1-bit signal and the clock signal supplied from said input means, for generating, when the clock signal is at a first level, one of a first reference potential and a second reference potential in response to the signal level of the 1-bit signal, and for generating, when the clock signal is at a second level, an intermediate potential between the first reference potential and the second reference potential;

second potential generating means for receiving the 1-bit signal supplied from said input means and the clock signal inverted by said inverting means, for generating, when the inverted clock signal is at the first level, one of the first reference potential and the second reference potential in response to the signal level of the 1-bit signal, and for generating, when the inverted clock signal is at the second level, the intermediate potential between the first reference potential and the second reference potential;

third potential generating means for receiving the 1-bit signal delayed by said first delay means and the clock signal supplied from said input means, for generating, when the clock signal is at the first level, one of the first reference potential and the second reference potential in response to the signal level of the delayed 1-bit signal, and for generating, when the clock signal is at the second level, the intermediate potential between the first reference potential and the second reference potential;

fourth potential generating means for receiving the 1-bit signal delayed by said first delay means and the clock signal inverted by said inverting means, for generating, when the inverted clock signal is at the first level, one of the first reference potential and the second reference potential in response to the signal level of the delayed 1-bit signal, and for generating, when the inverted clock signal is at the second level, the intermediate potential between the first reference potential and the second reference potential; and combining means for combining the potentials output from said first to fourth potential generating means.

2. The D/A converter according to claim 1 further comprising:

second delay means for delaying the 1-bit signal delayed by said first delay means;

third delay means for delaying the 1-bit signal delayed by said second delay means;

fifth potential generating means for receiving the 1-bit signal delayed by said second delay means and the clock signal supplied from said input means, for generating, when the clock signal is at the first level, one of the first reference potential and the second reference potential in response to the signal level of the delayed 1-bit signal, and for generating, when the clock signal is at the second level, the intermediate potential between the first reference potential and the second reference potential;

sixth potential generating means for receiving the 1-bit signal delayed by said second delay means and the clock signal inverted by said inverting means, for generating, when the inverted clock signal is at the first level, one of the first reference potential and the second reference potential in response to the signal level of the 1-bit signal, and for generating, when the inverted clock signal is at the second level, the intermediate potential between the first reference potential and the second reference potential;

seventh potential generating means for receiving the 1-bit signal delayed by said third delay means and the clock signal supplied from said input means, for generating, when the clock signal is at the first level, one of the first reference potential and the second reference potential in response to the signal level of the delayed 1-bit signal, and for generating, when the clock signal is at the second level, the intermediate potential between the first reference potential and the second reference potential; and eighth potential generating means for receiving the 1-bit signal delayed by said third delay means and the clock signal inverted by said inverting means, for generating, when the inverted clock signal is at the first level, one of the first reference potential and the second reference potential in response to the signal level of the delayed 1-bit signal, and for generating, when the inverted clock signal is at the second level, the intermediate potential between the first reference potential and the second reference potential, wherein said combining means combines the potentials output from said first to eighth potential generating means.

3. The D/A converter according to claim 2, wherein said D/A converter comprises N sets of said second and third delay means, and 4(N+1) potential generating means, where N is an integer.

4. The D/A converter according to claim 1, wherein said D/A converter including a combination of said input means, said delay means, said inverting means, said first to fourth potential generating means and said combining means is referred to as a first D/A converter, said D/A converter further comprising in addition to said first D/A converter:

a second D/A converter including a combination of input means, delay means, inverting means, first to fourth potential generating means and combining means similar to their counterparts of said first D/A converter;

intermediate potential generating means for generating the intermediate potential from the first reference potential and second reference potential, and for supplying the intermediate potential to said first to fourth potential generating means of said first and second D/A converters;

an inverter for inverting the 1-bit signal supplied to said input means of one of said first and second D/A converters, and for supplying its inverted output to said input means of the other of said first and second D/A converters; and a subtracter for outputting a differential signal between combined signals output from said combining means of said first and second D/A converters.

5. The D/A converter according to claim 4, wherein said combining means is composed of resistors constituting an input section of a filter circuit connected to an output of said D/A converter.

6. A D/A converter comprising:

input means for inputting a 1-bit signal and a clock signal with a data rate twice that of the 1-bit signal;

signal converting means for outputting, in synchronization with the clock signal supplied from said input means, a level signal assuming one of "1" and "−1" levels during a first half period of the 1-bit signal in response to the signal level of the 1-bit signal, and a level signal assuming a "0" level during a second half period of the 1-bit signal;

a plurality of delay means for delaying the level signal output from said signal converting means;

a plurality of potential generating means each for receiving the level signal output from one of said signal converting means and said plurality of delay means, and for generating one of a first reference potential, a second reference potential and an intermediate potential corresponding to the level signal; and combining means for combining the potentials generated by said a plurality of potential generating means.

7. The D/A converter according to claim 6, wherein said D/A converter comprises 4N−1 delay means, and 4N potential generating means, where N is an integer.

8. The D/A converter according to claim 6, wherein said D/A converter including a combination of said input means, said signal converting means, said plurality of delay means, said plurality of potential generating means and said combining means is referred to as a first D/A converter, said D/A converter further comprising in addition to said first D/A converter:

a second D/A converter including a combination of input means, signal converting means, a plurality of delay means, a plurality of potential generating means and combining means similar to their counterparts of said first D/A converter;

intermediate potential generating means for generating the intermediate potential from the first reference potential and the second reference potential, and for supplying the intermediate potential to said plurality of potential generating means of said first and second D/A converters;

an inverter for inverting the 1-bit signal supplied to said input means of one of said first and second D/A converters, and for supplying its inverted output to said input means of the other of said first and second D/A converters; and a subtracter for outputting a differential signal between combined signals output from said combining means of, said first and second D/A converters.

9. The D/A converter according to claim 8, wherein said combining means is composed of resistors constituting an input section of a filter circuit connected to an output of said D/A converter.

* * * * *